(12) United States Patent
Sakagami

(10) Patent No.: US 7,709,347 B2
(45) Date of Patent: May 4, 2010

(54) SEMICONDUCTOR DEVICE AND METHOD OF FABRICATING THE SAME

(75) Inventor: Eiji Sakagami, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/420,582

(22) Filed: Apr. 8, 2009

(65) Prior Publication Data

US 2009/0203186 A1 Aug. 13, 2009

Related U.S. Application Data

(62) Division of application No. 10/981,532, filed on Nov. 5, 2004, now abandoned.

(30) Foreign Application Priority Data

Nov. 6, 2003 (JP) ............................... 2003-376816

(51) Int. Cl.
  H01L 21/44 (2006.01)
  H01L 21/48 (2006.01)
  H01L 21/50 (2006.01)
  H01L 21/76 (2006.01)
  H01L 21/336 (2006.01)

(52) U.S. Cl. ........................ 438/424; 438/257; 438/296; 438/218

(58) Field of Classification Search ................. 438/257, 438/723, 294, 296, 593, 427, 211, 264, 706, 438/710, 719, 700, 207, 219, 221, 353, 218, 438/424

See application file for complete search history.

(56) References Cited

U.S. PATENT DOCUMENTS

| 5,192,993 | A | 3/1993 | Arai et al. |
| 5,543,649 | A | 8/1996 | Kim et al. |
| 6,020,229 | A * | 2/2000 | Yamane et al. ............... 438/201 |
| 6,314,021 | B1 | 11/2001 | Maeda et al. |
| 6,411,548 | B1 * | 6/2002 | Sakui et al. ............ 365/185.17 |
| 6,639,283 | B1 | 10/2003 | Hung et al. |
| 6,762,477 | B2 | 7/2004 | Kunikiyo |
| 6,844,590 | B2 * | 1/2005 | Goda et al. .................. 257/326 |
| 6,969,686 | B2 | 11/2005 | Hsieh et al. |

(Continued)

FOREIGN PATENT DOCUMENTS

JP 2000-156477 6/2000

(Continued)

*Primary Examiner*—Chuong A. Luu
(74) *Attorney, Agent, or Firm*—Oblon, Spivak, McClelland, Maier & Neustadt, L.L.P.

(57) ABSTRACT

A method of fabricating a semiconductor device, including: forming a first well of a second conduction type and a second well of a first conduction type on a semiconductor substrate of the first conduction type, forming a gate oxide corresponding to each element on a surface of the semiconductor substrate, forming trenches by etching at forming locations of first and second trench isolating regions respectively at a first depth larger than a depth of a diffusion layer formed in a memory-cell forming region within the second well and smaller than a depth of a diffusion layer of a transistor of a peripheral circuit region, executing additional etching at a forming location of the second trench isolating region so that a second depth larger than the first depth is obtained and doping the trenches at the forming locations of the first and second trench isolating regions respectively, with a doping agent, thereby executing a planarization process.

4 Claims, 21 Drawing Sheets

U.S. PATENT DOCUMENTS

| | | |
|---|---|---|
| 2002/0197795 A1 | 12/2002 | Saito |
| 2003/0042520 A1 | 3/2003 | Tsukamoto et al. |
| 2003/0151109 A1 | 8/2003 | Taniguchi et al. |
| 2003/0197242 A1 | 10/2003 | Chen et al. |

FOREIGN PATENT DOCUMENTS

| | | |
|---|---|---|
| JP | 2000-269448 | 9/2000 |
| JP | 2002-368077 | 12/2002 |
| JP | 2003-7864 | 1/2003 |

* cited by examiner

SEMICONDUCTOR DEVICE AND METHOD OF FABRICATING THE SAME

CROSS-REFERENCE TO RELATED APPLICATIONS

This application is a divisional application of Ser. No. 10/981,532, filed Nov. 5, 2004, it was abandoned which claims priority to Japanese patent application No. 2003-376816, the contents of both of which are incorporated hereinto by reference.

BACKGROUND OF THE INVENTION

1. Field of the Invention

The present invention relates to a semiconductor device employing a shallow trench isolation structure (STI) as an element isolating structure and a method of fabricating the semiconductor device.

2. Description of the Related Art

A technique of isolating elements has recently been changing from local oxidation of silicon (LOCOS) to shallow trench isolation (STI) for the purposes of high integration and miniaturization in the fabrication process of semiconductor memory devices. In the element isolation technique employing STI, shallow trenches are formed and filled with an isolator so as to be flattened, whereupon a trench isolating region is provided.

Furthermore, in the element isolating technique employing STI, the trench isolating region is set so as to have a minimum width in a region of a memory cell. With this, a depth of the trench isolating region is reduced in order that a filling capacity of the trench isolating region may be ensured in the aforesaid region of the memory cell, whereby an aspect ratio is required to be reduced as much as possible in filling the trench isolating region.

However, a peripheral circuit performing drive control of the memory cell includes elements which are required to have a higher breakdown voltage than those in the memory cell. Accordingly, when the aforesaid trench isolating region is employed, the distance of isolation between elements or the width of the trench isolating region is increased or a stopper region is formed under the trench isolating region. However, either method requires a large width of trench isolating region in order that a large element isolation width may be ensured or a stopper region may be formed, resulting in a problem that an area for the element isolation is increased.

To overcome the above-described problem, JP-A-2002-368077 discloses a structure in which the depth of the trench isolating region of the peripheral circuit is larger than a depth of a diffusion region of a cell array. As the result of the structure, since the trench isolating region with a depth in accordance with the breakdown voltage is formed, an increase in the area of the cell is limited and the breakdown voltage can reliably be ensured.

However, the STI technique forming a trench isolating region with a depth in accordance with the breakdown voltage results in the following new problem: a non-volatile memory generally comprises a memory cell and a peripheral circuit. The peripheral circuit includes a circuit requiring a high breakdown voltage (a high withstand circuit) and a logic circuit requiring a current drive capability but not a high breakdown voltage (a low withstand circuit). The high breakdown voltage circuit requires a breakdown voltage of a gate isolation film as well as the breakdown voltage between diffusion layers. Accordingly, the gate isolation film of a high breakdown voltage transistor requires a larger film thickness than the gate isolating film of a low breakdown voltage transistor. As a result, when the film thicknesses of the gate dielectric films required in the respective circuits are compared with one another, the gate isolating film of a high breakdown voltage transistor requires a larger film thickness than that of the memory cell transistor, while the required film thickness of the gate isolation film of the memory cell transistor is as large as or larger than that of the low breakdown voltage transistor.

A circuit for controlling the cell array of the non-volatile memory needs to be formed by high breakdown voltage transistors in order to control write of data onto the memory cell and deletion of data therefrom. Accordingly, the memory cell region (a region where a gate dielectric film of the memory cell is formed) is encompassed by the region of high breakdown voltage gate dielectric film.

In the above-described case, in order that the width of the trench isolating region may be reduced in the high breakdown voltage region or the insulation film of the high breakdown voltage circuit, a depth of the trench isolating region formed into a high breakdown voltage element is increased so that the breakdown voltage is ensured in the direction of depth, and, in the memory cell region (in the region where the gate isolation film of the memory cell is formed), a shallow trench isolating region is formed in order that the aspect ratio may be ensured with the width at which the breakdown voltage is ensured, whereupon the element region can be reduced.

In the prior art as shown in the foregoing document, a shallow trench isolating region with a small width is formed for the purpose of reduction in size in the high breakdown voltage element forming region or low breakdown voltage element forming electrode. However, since such consideration as described above is not given to a boundary region between the trench isolating regions, the width of the boundary region between the element forming regions is increased as the number of element forming regions is increased. Consequently, there is a definite limit in the reduction in the size of the semiconductor memory device.

Additionally, the prior art as shown in the foregoing document has the following defects in the fabricating process. FIGS. 24A and 24B explain the defects in the case where two types of trench isolating regions are provided. FIG. 24A typically shows the section of a boundary region 4 located between a memory cell region 2 and a high breakdown voltage circuit region 3 both formed on a silicon substrate 1.

A thin gate dielectric film 5 is formed on the memory cell region 2, whereas a thick gate dielectric film 6 is formed on the high breakdown voltage circuit region 3. A polycrystalline silicon film 7 and a chemical mechanical polishing (CMP) stopper film 8 are deposited on upper surfaces of the gate dielectric films 5 and 6 in turn. A shallow trench 9 (for forming a shallow trench isolating region) is formed in the memory cell region 2, whereas a deep trench 10 (for forming a deep trench isolating region) is formed in the high breakdown voltage circuit region 3. A doping agent 11 for isolating film is formed so as to cover the aforementioned films and trenches.

When two types of trench isolating regions having respective depths d1 and d2, the doping agent 11 needs to be deposited thick according to the deeper trench 10 in order that shallow and deep trenches 10 may be simultaneously embedded. In such a case, accordingly, the doping agent 11 is deposited so that its thickness $T_{cell}$ in the shallow trench 9 is larger than its thickness $T_{HV}$ in the deep trench 10 on the surface of the silicon substrate 1.

When a planarization process is carried out by the CMP method while the trenches have been doped with the doping agent 11, in order that the thick doping agent 11 deposited on the cell region 2 may be removed, the CMP process is carried out excessively by the difference in the film thickness for the doping agent 11 deposited on the peripheral deep trench 10 since the memory cell 2 side is smaller than the high breakdown voltage circuit region 3 side regarding the heights H1 and H2 from the surface of the stopper film 8 of the CMP to the surfaces of the trenches 9 and 10 respectively.

In such a case as described above, there is a possibility that the CMP process, when carried out, may cause dishing in the trench isolating region 12 formed in the boundary region 4 between the high breakdown voltage circuit region 3 and the memory cell region 2, resulting in a problem of abnormal shape. In particular, the width of the trench isolating region needs to be increased in the boundary region 4 since a well isolation is also carried out. Dishing D as shown in FIG. 24B tends to occur in the boundary region 4 between the memory cell region 2 and the high breakdown voltage circuit region 3 during CMP since the width of the trench isolating region is required to be increased for additional execution of well isolation, and the boundary region 4 is located between two regions of the peripheral region where the memory cell region 2 and the high breakdown voltage circuit region 3 both having different height distributions of the doping agent 11.

A dummy pattern is suggested to be disposed on an end of the cell array region to prevent dishing in order that an adverse effect of the dishing may be reduced. However, the number of dummy patterns needs to be increased with increase in the degree of dishing, whereupon a new problem arises that an area of the cell (or chip size) should be increased.

Furthermore, the process of doping the trenches 9 and 10 with a doping agent is carried out after formation of the gate dielectric films 5 and 6 in a self-aligned STI (SA-STI) process. In the SA-STI process, the difference in the height between the CMP stopper films 8 depends upon the difference in the film thickness between the gate dielectric films 5 and 6 of the memory cell region 2 and the high breakdown voltage circuit region 3 as well as the difference in the film thickness between the regions 2 and 3. This difference in the height between the CMP stopper films 8 also results in abnormal shape, such as erosion (dishing), scratch, etc., due to the CMP process in the boundary region 4 between the memory cell region 2 and the high breakdown voltage circuit region 3. Additionally, when the stopper film 8 is peeled by the dishing due to the CMP process in the memory cells of the cell array located in the vicinity of the boundary region 4, the height of the trench isolating region in the peeled portion is reduced, which reduction in the height results in various variations in the processing of memory cells and increases the variations in the electric characteristics of the memory cells.

BRIEF SUMMARY OF THE INVENTION

Therefore, an object of the present invention is to provide a semiconductor device in which an increase in the chip area and occurrence of dishing or the like can be prevented although trench isolating regions with different depths are formed and a method of fabricating such a semiconductor device.

The present invention provides a semiconductor device comprising a semiconductor substrate of a first conduction type, a first well of a second conduction type formed on the semiconductor substrate, a plurality of second wells of the first conduction type provided in the first well for forming memory cells and a peripheral circuit respectively, each second well having a first depth, a first trench isolating region formed so as to isolate an element within the second well for the memory cells and having a first depth, a guard-ring diffusion region of the first conduction type provided in the vicinity of a peripheral edge of each second well for the memory cells and doped with a high density impurity so as to encompass a forming region of the memory cells, a second trench isolating region formed so that a p-n junction of each second well terminates on a bottom thereof in the vicinity of an outside of the guard-ring diffusion region, the second trench isolating region having a second depth larger than the first depth of each second well, and a third trench isolating region isolating an element formed in each second well for the peripheral circuit, the third trench isolating region having the second depth.

The invention also provides a method of fabricating a semiconductor device, comprising forming a first well of a second conduction type and a second well of a first conduction type on a semiconductor substrate of a first conduction type, forming a gate oxide corresponding to each element on a surface of the semiconductor substrate, forming trenches by etching at forming locations of first and second trench isolating regions respectively at a first depth larger than a depth of a diffusion layer formed in a memory-cell forming region within the second well and smaller than a depth of a diffusion layer of a transistor of a peripheral circuit region, executing additional etching at a forming location of the second trench isolating region so that a second depth larger than the first depth is obtained, and doping the trenches at the forming locations of the first and second trench isolating regions respectively, with a doping agent, thereby executing a planarization process.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

One embodiment of the present invention will be described with reference to the accompanying drawings. In the following embodiment, the invention is applied to a semiconductor device represented by a flash memory (non-volatile memory) in which elements are isolated by a self-aligned STI method in which an STI doping process is carried out after formation of gate dielectric films.

Figure 1:
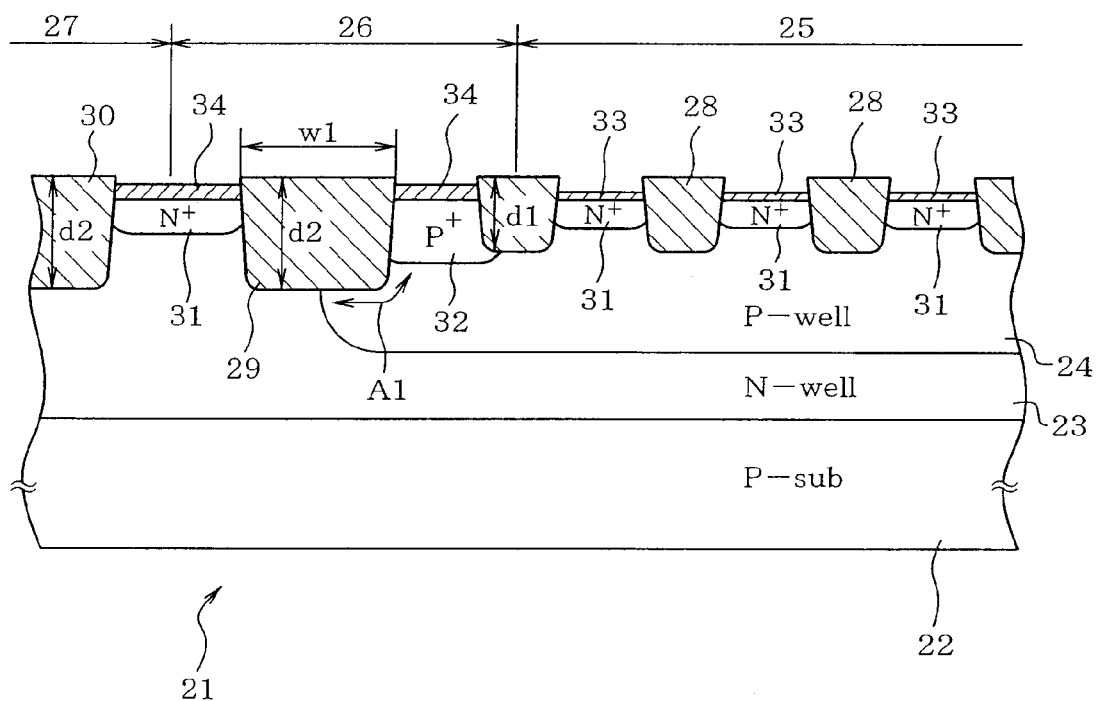
FIG. 1 is a typical sectional view of a semiconductor device in accordance with one embodiment of the present invention.

Referring to FIG. 1, the structure of a non-volatile memory 21 is shown as a semiconductor device fabricated by the fabricating method as will be described later. A p-type (a first conduction type) silicon substrate (P-sub) 22 serving as a semiconductor substrate is formed with an N-well 23 serving as a first well. A P-well 24 serving as a second well is formed in the N-well 23. A memory-cell forming region 25 is formed in the P-well 24. A boundary region 26 is formed in a peripheral portion of the P-well 24. A peripheral circuit 27 is formed outside the P-well 24. The peripheral circuit region 27 is formed with a P-well serving as a second well 24 and other wells.

A number of transistors constituting each memory cell are formed in an inner region of the P-well 24. A number of first trench isolating regions 28 (first STI) are formed for isolating the transistors. A second trench isolating region 29 (second STI) is formed in an outermost periphery on a surface of which the p-n junction of the P-well 24 terminates. A number of transistors are formed in the peripheral circuit region 27 which is a region outside the P-well 24. A third trench isolating region 30 (third STI) is formed for isolating the transistors in the same manner as described above. The first STI 28 has a depth d1 set so as to be larger than depths of the second and third STI's 29 and 30.

An N-channel transistor of a memory-cell forming region 25 has a source/drain region 31 filled with high density N-type impurity and formed at a diffusion depth smaller the first STI 28. A guard-ring diffusion region 32 is formed just inside the P-well 24 in the outer peripheral region of the memory-cell forming region 25. The guard-ring diffusion region 32 is formed by filling an annular region with high density P-type impurity. The guard-ring diffusion region 32 has a diffusion depth set to be larger than that of the first STI 28 and smaller than that of the second STI 29.

A gate oxide 33 having a first film thickness is formed on the surface of a silicon substrate 22 of each transistor in the memory-cell forming region 25. A gate oxide 34 having a second film thickness is formed on the surfaces of the silicon substrate 22 of the boundary region 26 and the peripheral circuit region 27. The second film thickness of the gate oxide 34 is set to be larger than the first film thickness of the gate oxide 33. A transistor having a gate oxide 35 with a third film thickness set to be smaller than the first film thickness is formed in the peripheral circuit 27 (see FIG. 19, for example), as will be described in the fabrication process although not shown in FIG. 1.

When the first STI 28 is formed shallow, an aspect ratio can be rendered lower even if a width thereof is reduced. Furthermore, the second and third STI's 29 and 30 are formed deeper than the guard-ring diffusion region 32, so that the guard-ring diffusion region 32 can obtain a margin in the direction of its depth relative to spread of a depletion layer of the guard-ring diffusion region 32. As a result, a predetermined breakdown voltage can be ensured with space saving without an increase in the width W1 of the second STI 29.

Figure 23:
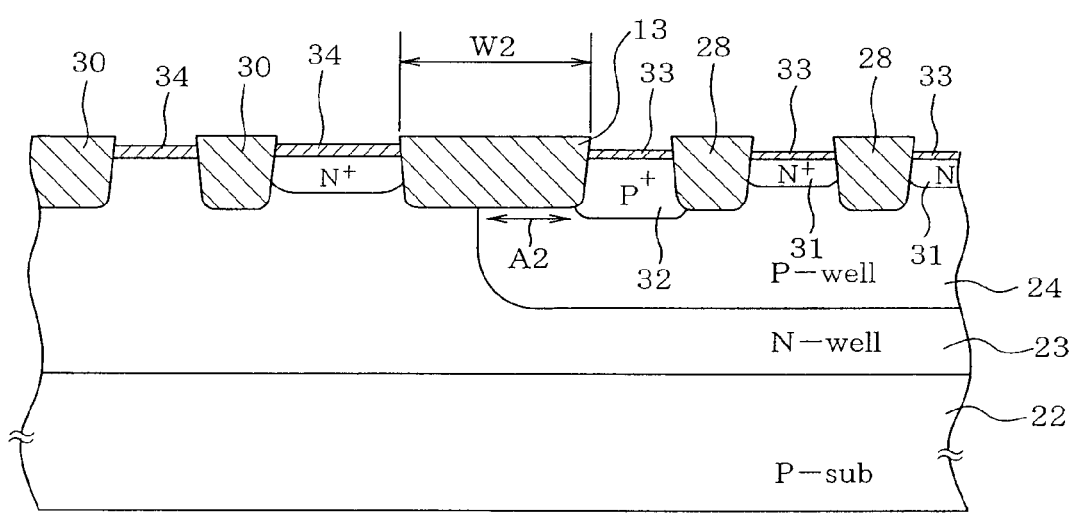
FIG. 23 is a view similar to FIG. 1, showing a prior art for the purpose of comparison.
Figure 24A:
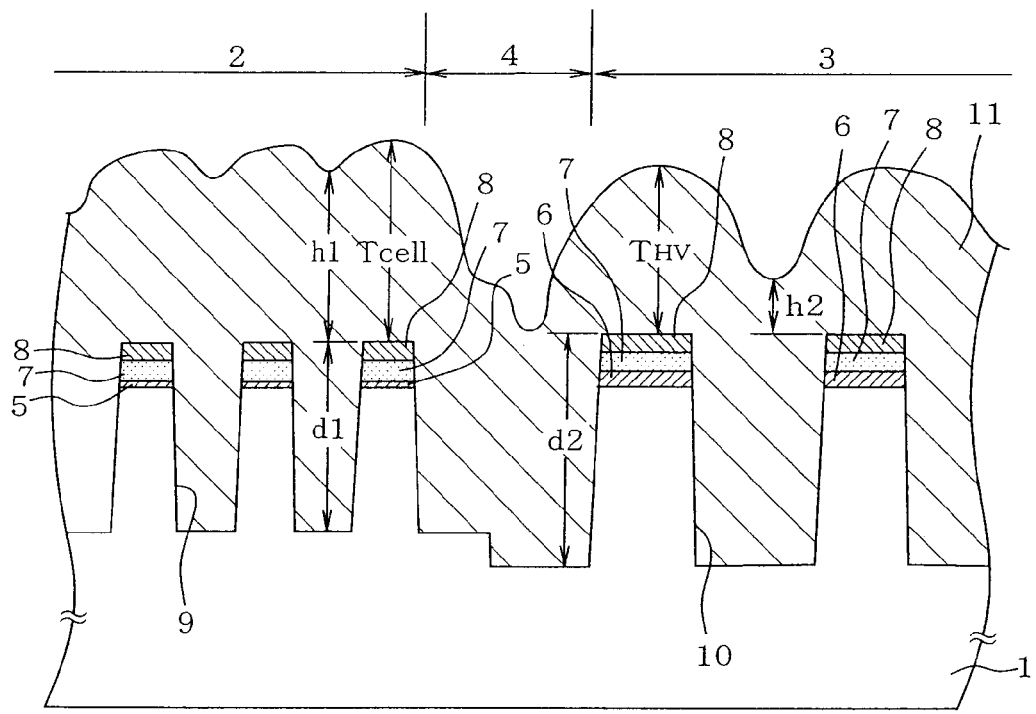
FIG. 24 is a view similar to FIG. 11, showing the prior art.
Figure 24B:
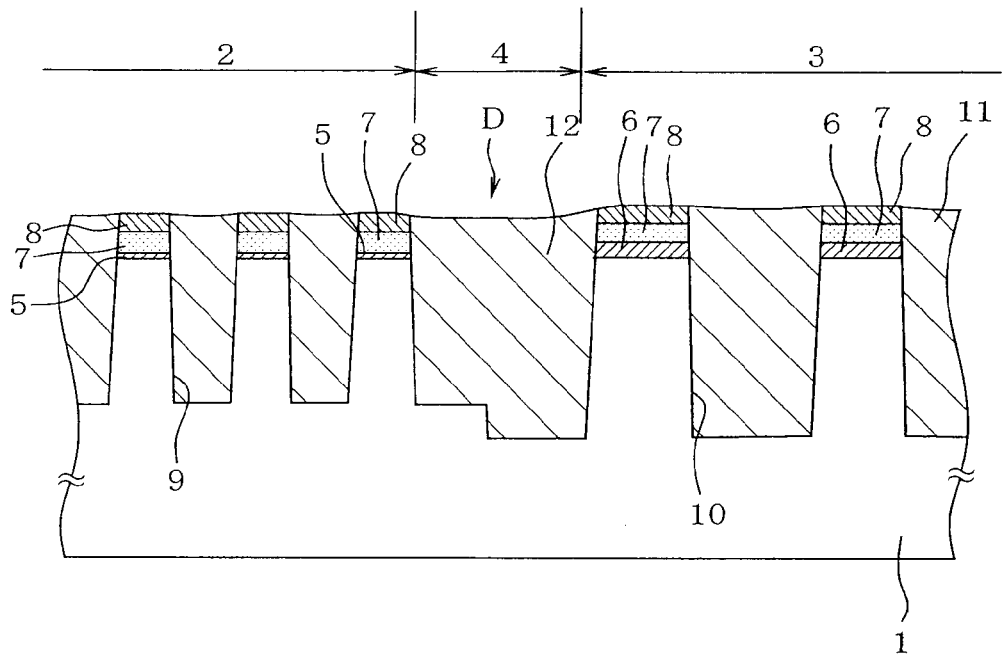

The foregoing effect will be described in comparison of the embodiment with conventional structure as shown in FIG. 23. In FIG. 23, similar parts to those in the structure in FIG. 1 are labeled by the same reference symbols. In the difference, a trench isolating region 13 is provided which has a depth set so as to be equal to that of the first STI 28 of the memory-cell forming region 25 instead of the second STI 29. In this arrangement, the trench isolating region 13 located at the outer periphery of the memory-cell forming region 25 has a depth set to be smaller than the depth of the guard-ring diffusion region 32. Accordingly, a width A2 of a depletion layer of the guard-ring diffusion region 32 has fewer margins than the width A1 in FIG. 1 and needs to be set larger than the width W1 of the second STI 29 in the embodiment. In the conventional arrangement, however, existence of a number of boundary regions 26 is an important factor which increases the chip area, resulting in reduction in the number of the memory cells per unit area. When the arrangement of the embodiment is employed in consideration of the foregoing, the fabricated flash memory can ensure the predetermined breakdown voltage without increase in the chip size.

Furthermore, the foregoing arrangement employs the structure that the gate oxide film with the second film thickness on the surface of the silicon substrate 22 of the boundary area 26. As a result, the elements formed inside the substrate can be prevented from being damaged by the defect such as dishing or erosion in the CMP process, and thus, the product can achieve a high and stable quality.

Figure 2:
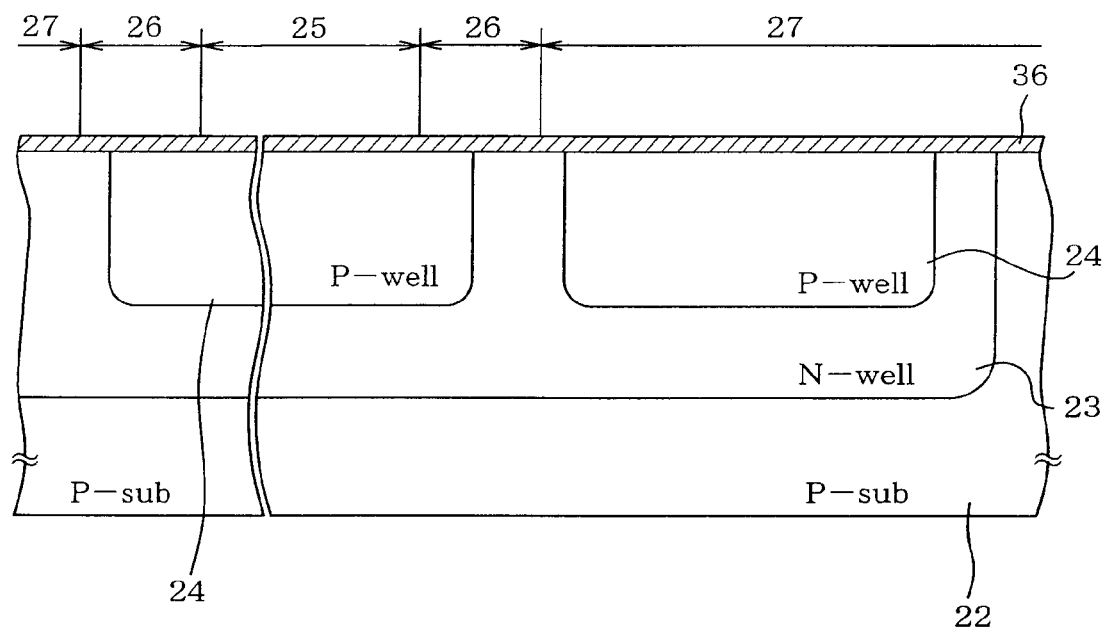
FIGS. 2 to 16 are typical sectional views of the semiconductor device in sequential fabricating steps.

The fabrication process of the flash memory will now be described with reference to sectional views at several steps thereof. Referring to FIG. 2, an oxide film 36 having a film thickness ranging from 5 to 25 nm is formed over the entire surface of P-type silicon substrate 22 serving as a semiconductor substrate by thermal oxidation. Subsequently, a photolithography process is applied to the oxide film 36 so that a mask aligning mark (not shown) is patterned on the oxide. Thereafter, P- and N-wells serving as first and second wells are formed and the substrate is then masked using a resist patterned by the photolithography in order that an impurity profile may be adjusted in channel regions of transistors of the memory-cell forming region 25 and peripheral circuit region 27. An impurity is implanted into the silicon substrate 22 by ion implantation.

Subsequently, the aforesaid oxide film 36 is removed by etching so that a tunnel oxide film with a thickness ranging from 5 to 10 nm is formed on the entire surface thereby to form a first gate oxide film 33 corresponding to the memory-cell forming region 25, as shown in FIG. 1. Thereafter, a first polycrystalline silicon film serving as a floating gate of the memory cell is deposited. A first silicon nitride film is deposited to prevent oxidation during formation of gate oxide of the peripheral circuit region 27 in the subsequent step. Each of the films has a film thickness of 70 nm, for example.

Figure 3:
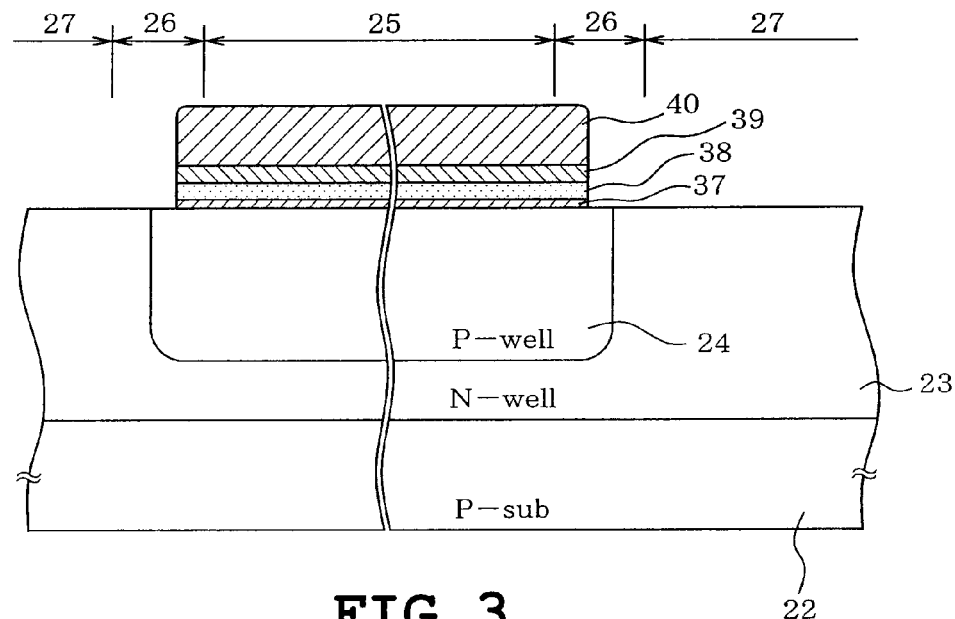
Figure 4:
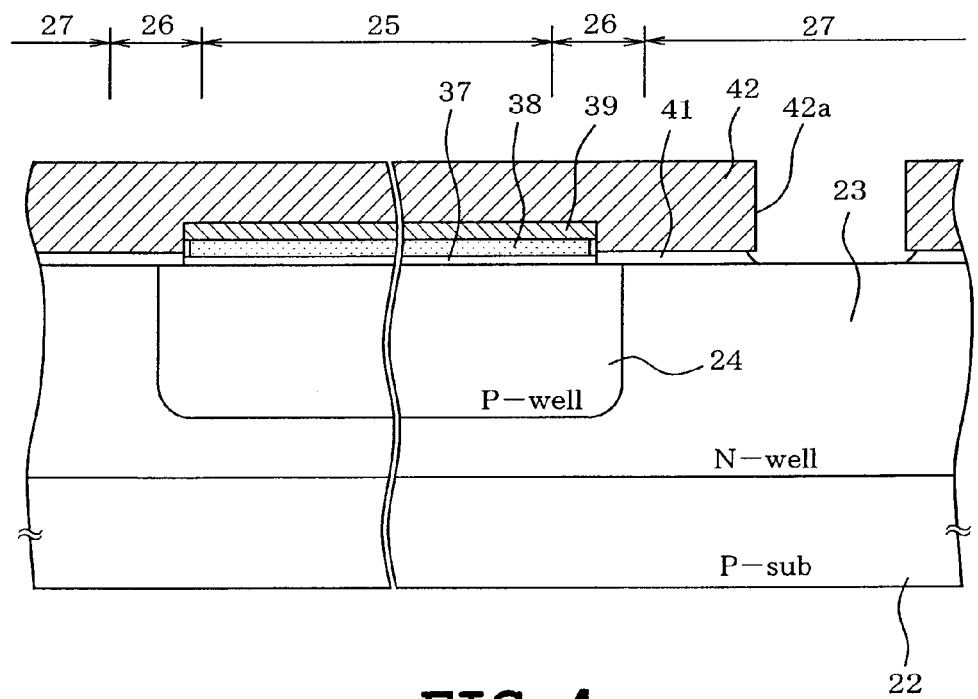

A photoresist 40 is patterned by photolithography as shown in FIG. 3. Dry etching is performed for a first silicon nitride film 39 and first polycrystalline silicon film 38. A tunnel oxide film 37 is removed, for example, by wet etching. Consequently, the tunnel oxide film 37, polycrystalline silicon film 38, silicon nitride film 39 and photoresist 40 are sequentially deposited over the memory-cell forming region 25.

Subsequently, an oxide film 41 is formed by thermal oxidation over the silicon substrate 22 of the peripheral circuit region 27 so as to have a predetermined thickness ranging from 10 to 35 nm, for example, in order that a second gate oxide film 34 as shown in FIG. 1 may be formed on the silicon substrate 22. In this case, the first polycrystalline silicon film 38 of the memory-cell forming region 25 is prevented from being oxidized since it is protected by the silicon nitride film 39.

Figure 5:
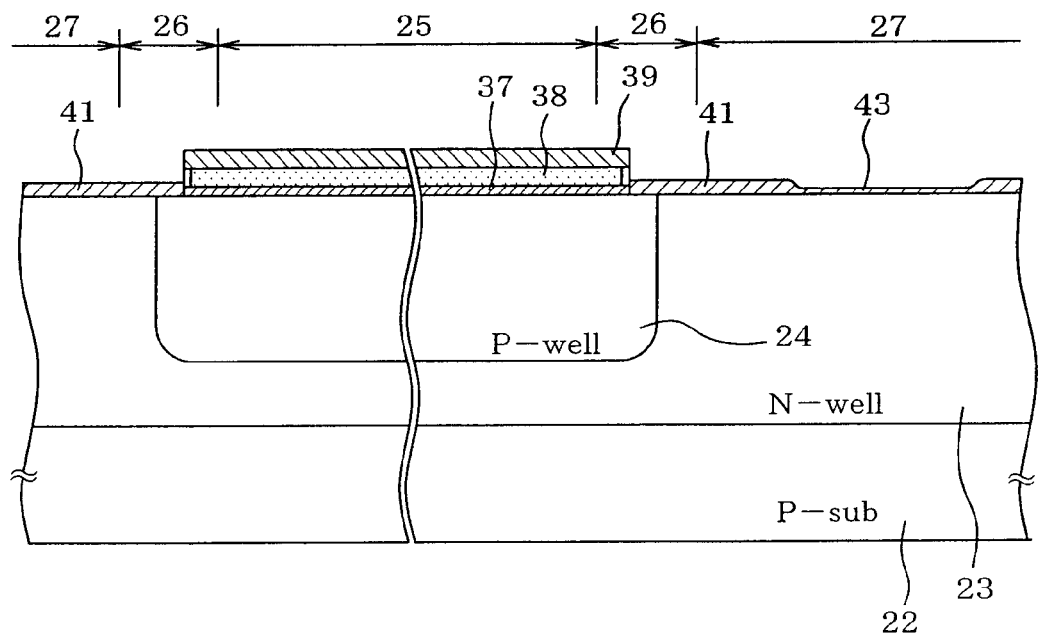
Figure 6:
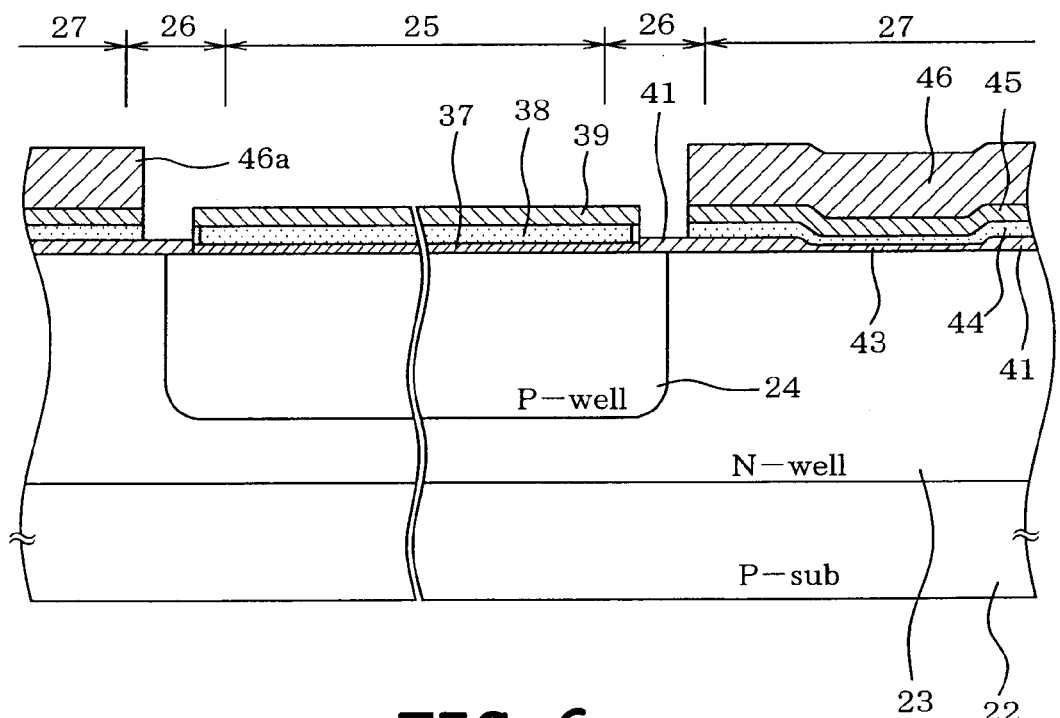
Figure 19:
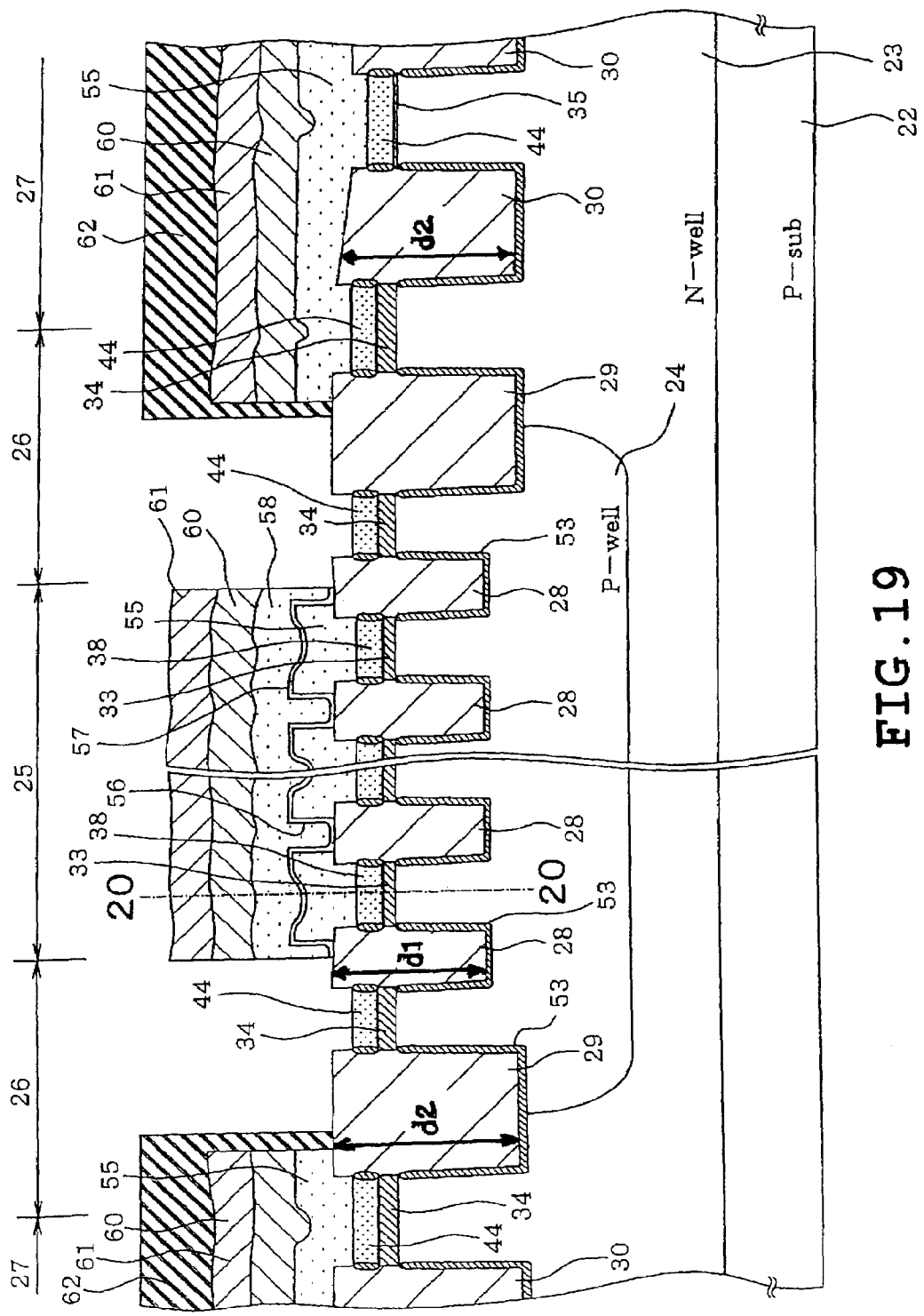
FIG. 19 is a typical sectional view of a part of the semiconductor device in a fabricating step.

Successively, a photoresist 42 is patterned by the photolithography process so that an opening 42a is formed in order that a third gate oxide film 35 as shown in FIG. 19 may be formed on the surface of the silicon substrate 22 of the low breakdown voltage peripheral circuit 27. The second gate oxide film 41 exposed under the opening 42a is removed, for example, by the wet etching. Subsequently, the photoresist 42 is removed and thermal oxidation is carried out so that a third gate oxide film 43 of the low breakdown voltage is formed so as to have a film thickness ranging from 3 to 7 nm in the portion where the second gate oxide film 41 has been removed, as shown in FIG. 5. In this case, the second gate oxide film 41 has a film thickness obtained by the first and second gate oxidation processes.

Subsequently, a second polycrystalline silicon film 44 and a second silicon nitride film 45 are formed over the entire peripheral circuit region 27. The second polycrystalline silicon film 44 has a film thickness as large as the first polycrystalline silicon film 38. The second silicon nitride film 45 has a film thickness as large as the first polycrystalline silicon film. A photoresist 46 is patterned so that an opening 46a is formed so that the upper sides of the memory-cell forming region 25 and boundary region 27 are exposed. Thereafter, the second silicon nitride film 45 and second polycrystalline silicon film 44, both exposed at the opening 46a of the photoresist 45, are removed by the dry etching process.

Figure 7:
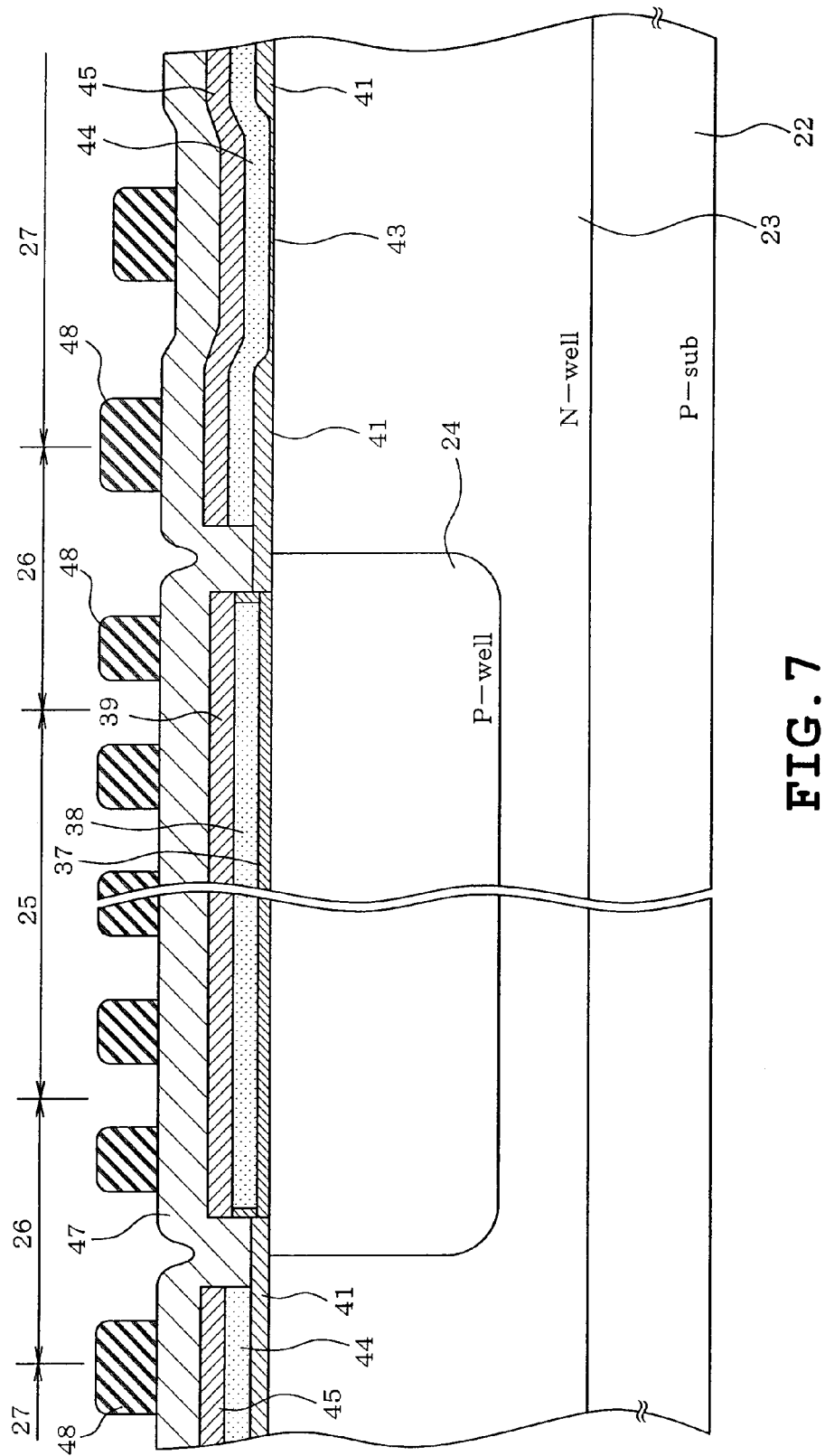

After the photoresist 46 has been removed, a tetra-ethyl ortho-silicate oxide film (TEOS) 47 is deposited by CVD or the like over the entire surfaces of the second silicon nitride film 45 and the silicon nitride film 39 so as to have a film thickness ranging from 100 to 250 nm, as shown in FIG. 7. Thereafter, a photoresist mask 48 is formed by photolithography to pattern the active region (silicon substrate 22 part).

The resist mask 48 is used to etch the TEOS oxide film 47, first and second silicon nitride films 39 and 45, first and second polycrystalline silicon films 38 and 44, and first to third oxide films 37, 41 and 43 sequentially in this order by a reactive ion etching (RIE) so that these films are removed. Thereafter, the photo resist 48 is peeled off by the same manner as conventionally carried out. Consequently, the pattern of the active region has been transcribed from the resist mask to a hard mask of the stacked film structure comprising oxide film/silicon nitride film/polycrystalline silicon film/oxide film.

Figure 8:
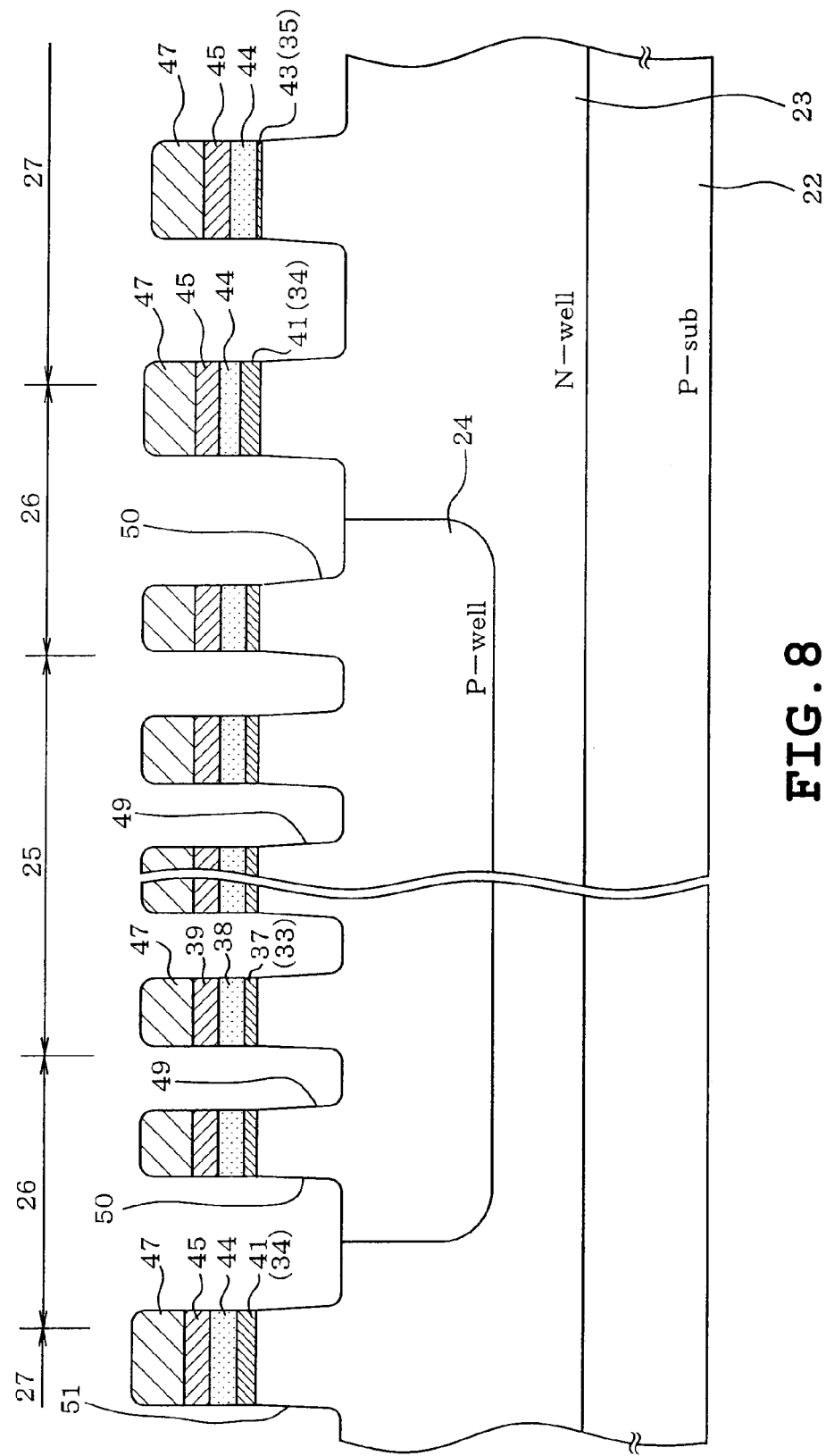

The silicon substrate 22 is etched by RIE with the stacked film structure serving as a hard mask, so that trenches 49 to 51 of the first STI to the third STI are patterned respectively as shown in FIG. 8. In this case, the depths of the trenches 49 to 51 are set to 200 nm, for example and an anisotropic etching is carried out. An etching depth in this case corresponds to the depth of the first STI 28 shown in FIG. 1.

Figure 9:
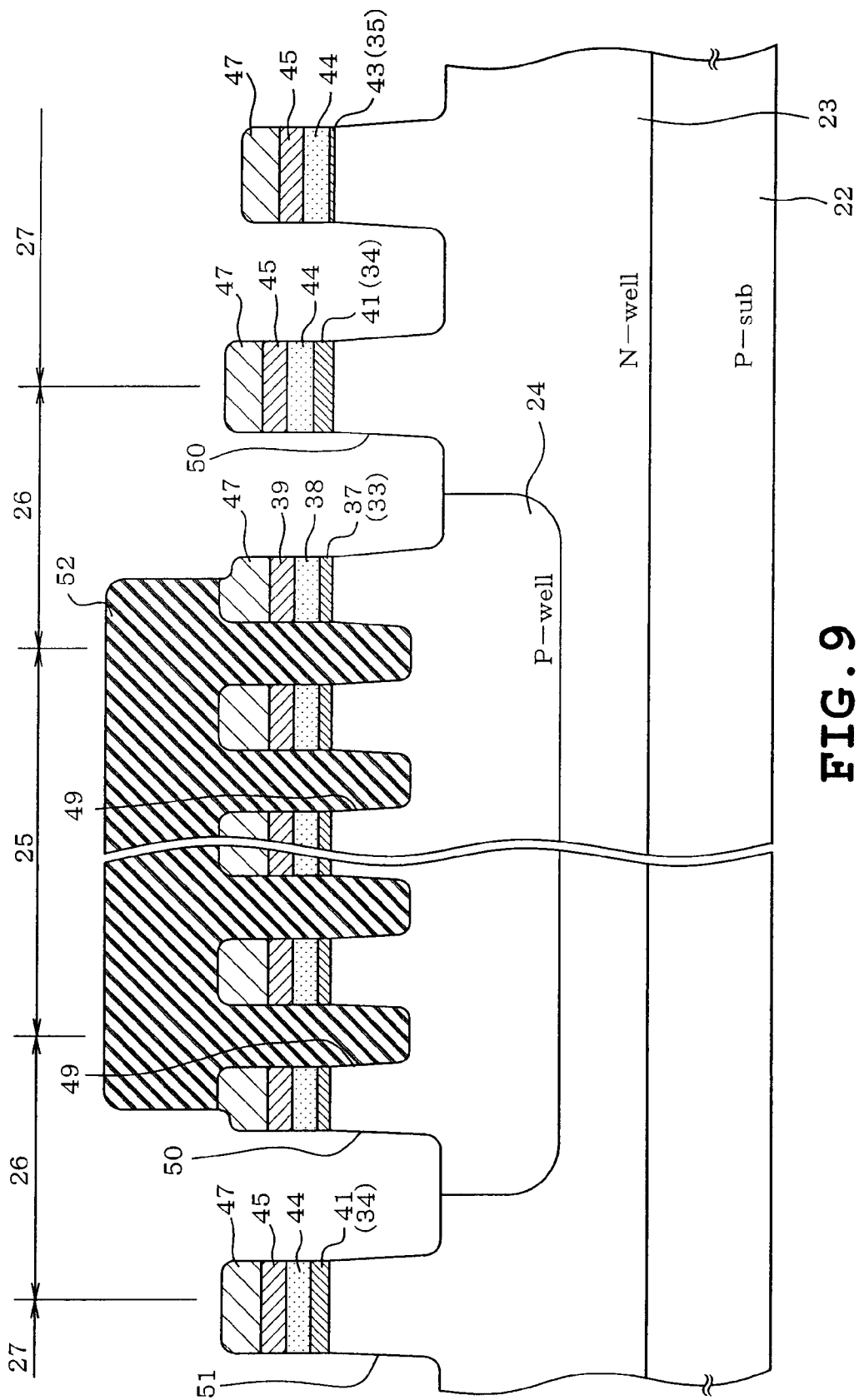

The memory-cell forming region 25 is patterned so as to be covered by a photoresist 52, so that the top of the peripheral circuit region 27 is open, as shown in FIG. 9. The silicon substrate is dry-etched via the opening by RIE so that trenches 50 and 51 deeper than the trench 49 of the memory-cell forming region 25 are formed. In this case, the depths of the trenches 50 and 51 are set so as to be larger than a depth of a high density P-type impurity diffusion region of a P-MOS transistor, for example, which is a deepest diffusion layer of all the diffusion layers of transistors formed in the boundary region 26 and peripheral circuit region 27. For example, the depth of the high density P-type impurity diffusion region of the P-MOS transistor is 350 nm, whereas the depth of each of the trenches 50 and 51 is 380 nm. As a result, the width between elements of MOS transistors in the peripheral circuit region 27. This step is carried out such that the shallow trenches 49 in the memory-cell forming region 25 are formed separately from the deep trenches 50 and 51 in the peripheral circuit forming region 27.

Figure 10:
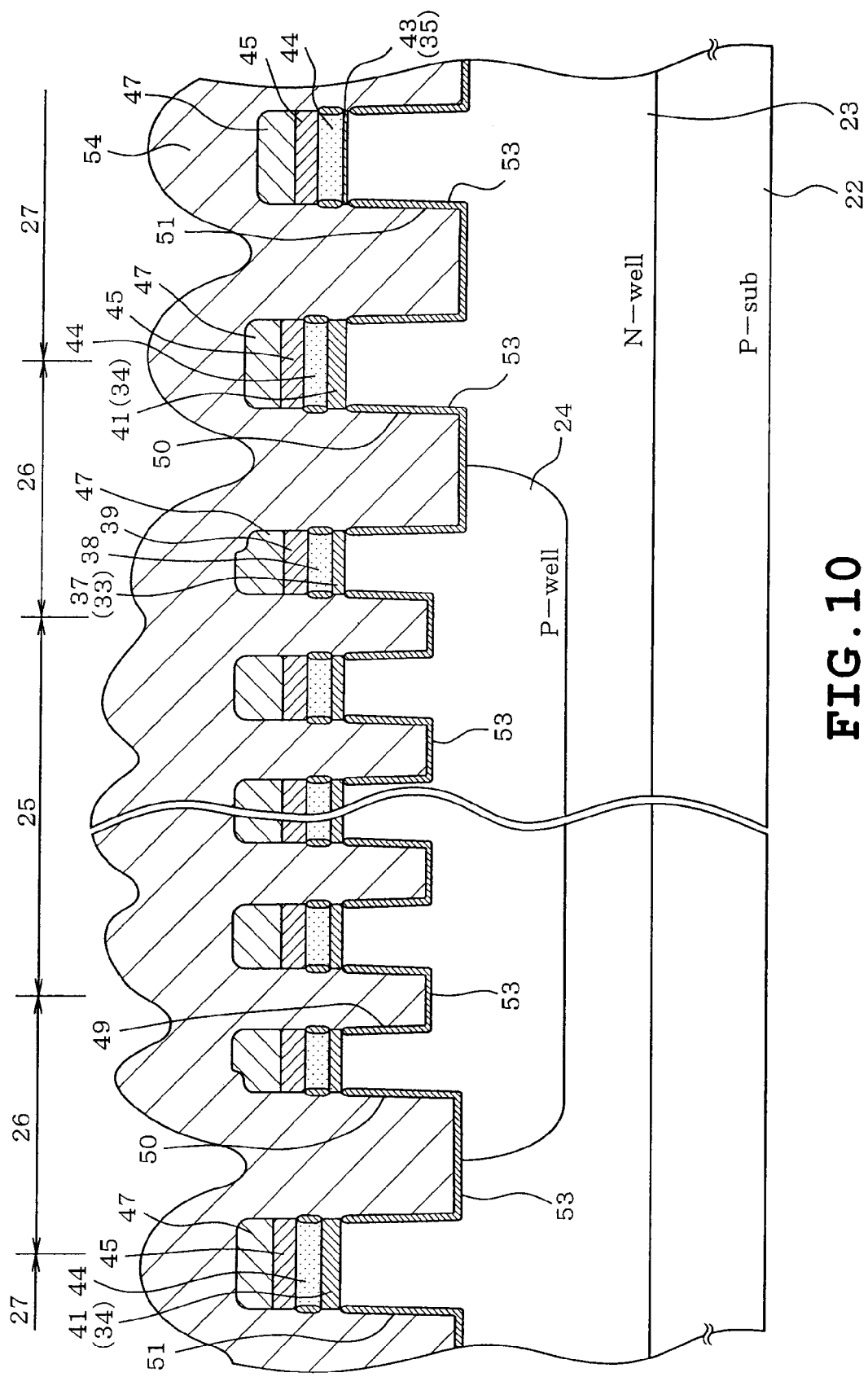

Subsequently, the photoresist 52 formed in the above-mentioned step is peeled off and the patterned silicon substrate 22 is formed by thermal oxidation or the like into oxide films 53 which are located on the inner surfaces of the trenches 49 to 51 and have respective depths ranging from 2 to 4 nm. Successively, an oxide film 54 serving as a doping agent between elements is deposited so that the arrangement as shown in FIG. 10 is obtained. A method of depositing the oxide film 54 includes depositing a TEOS oxide film by CVD process and depositing an SiH4 oxide film by high density plasma (HDP) process. An amount of oxide film 54 to be deposited is set so that the oxide film 54 fills from the silicon substrate 22 of the bottoms of the deeper trenches 50 and 51 to the surfaces of the silicon nitride films 39 and 45 which are formed into the mask material of the CMP.

Figure 11:
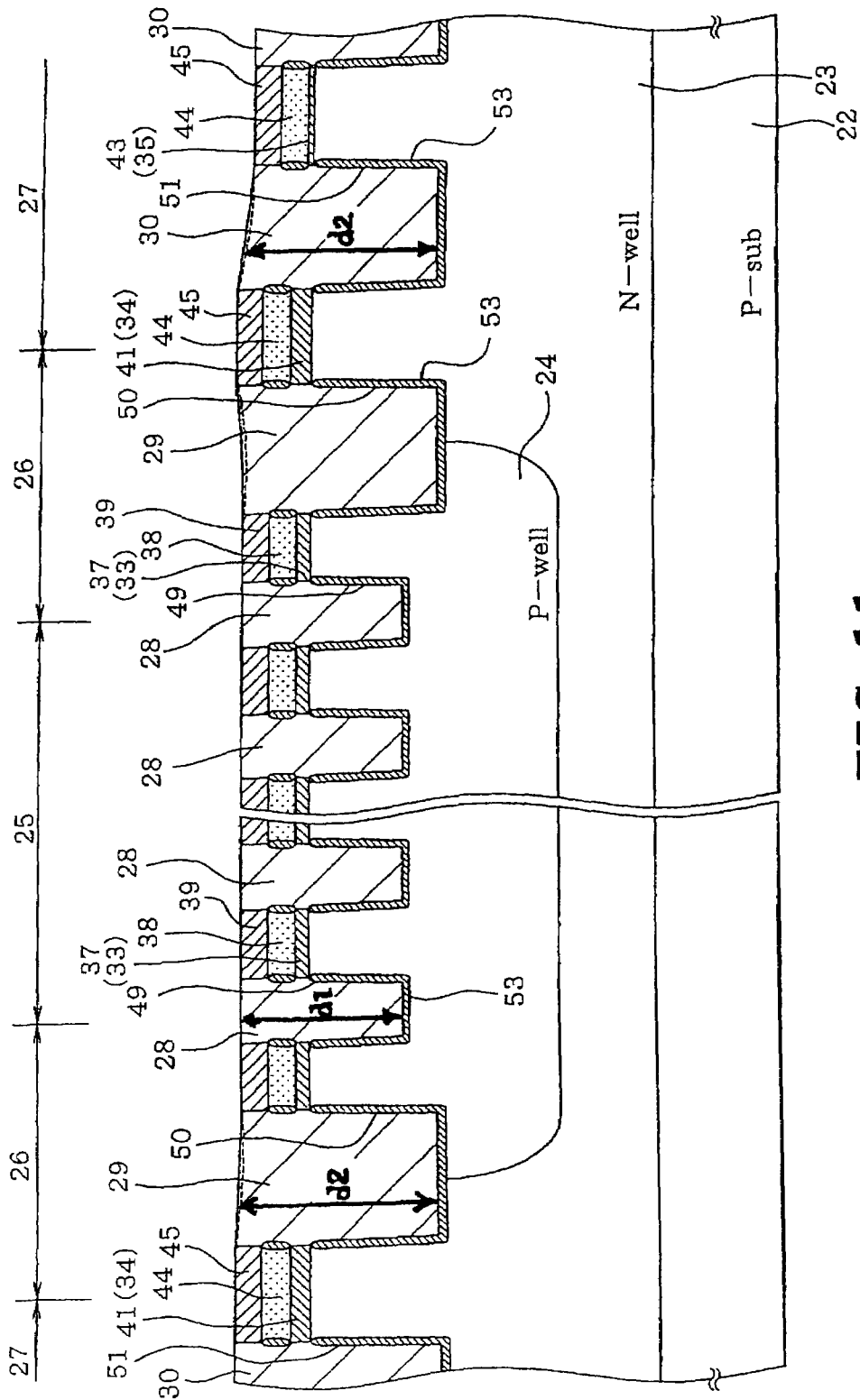

The doped oxide film 54 is polished by the chemical mechanical polishing (CMP) process so that the planarization process is carried out for the oxide film 54, as shown in FIG. 11. In this case, first and second silicon nitride films 39 and 45 both used as the hard masks serve as stopper layers of CMP. In order that part of the thick oxide film 54 deposited over the memory-cell forming region 25 may be removed, another part of the oxide film 54 deposited over the peripheral third STI 30 is excessively processed by the CMP planarization due to a difference in the film thickness. The reason for this is that as compared with the memory-cell forming region 25, the peripheral circuit region 27 has a smaller difference in the height from the silicon nitride films 39 and 45 serving as the CMP stoppers to the doping agent deposited over the third STI 30.

In the aforementioned case, there is a high possibility that the CMP planarization process may cause dishing in the second STI 29 formed in the boundary region 26 between the third STI 30 of the high breakdown voltage region of the peripheral circuit region 27 and the outer periphery of the memory-cell forming region 25, resulting in a problem of abnormal shape by STI. In particular, as shown in FIG. 11, dishing due to CMP is easy to occur in the boundary region 26 since a large STI width is necessitated for additional execution of well isolation in the boundary region 26 and since the boundary region is located between the memory-cell forming region 25 and the peripheral circuit region 27 both having different distributions of the height of oxide film 54.

Furthermore, in the SA-STI process in the embodiment, the height difference between the silicon nitride films 39 and 45 serving as the CMP stoppers in the STI process results from the difference in the film thickness between the gate insulation films 37 and 41 in the high breakdown voltage regions of the memory-cell forming region 25 and the peripheral circuit region 27. The stopper height difference also results in an abnormal shape in STI such as dishing in the boundary region 26, in addition to the film thickness difference of the oxide films 54 in the memory-cell forming region 25 and the peripheral circuit region 27. In particular, the abnormal shape due to STI at the boundary region 26 side of the cell array (the shape shown by broken line in the second STI 29 as shown in FIG. 11) results in cell defectives and increase in the variations in the cell characteristics.

Figure 12:
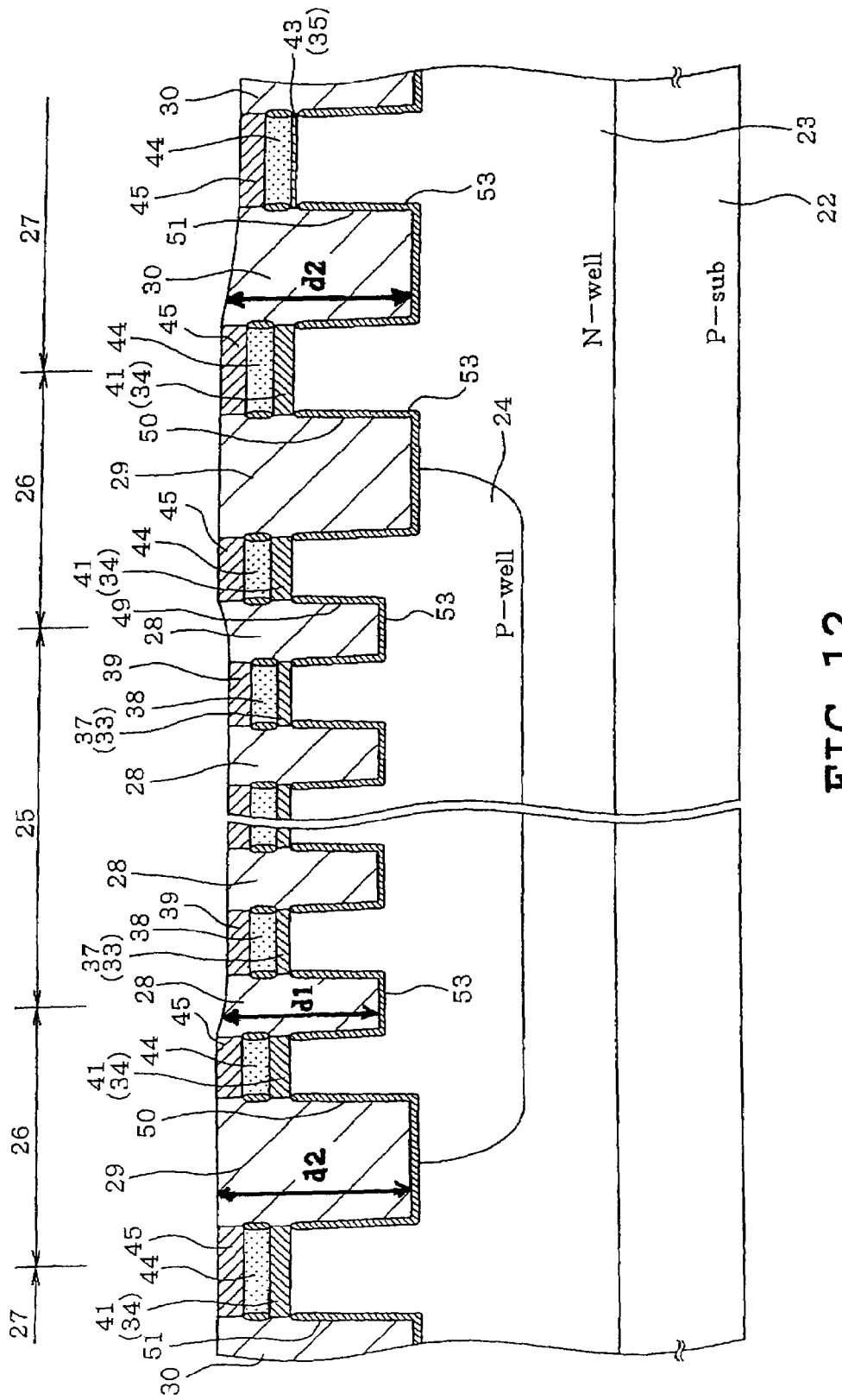

In view of the foregoing problem, as shown in FIG. 12, the gate oxide film 41 having a second film thickness is formed on the surface of the guard-ring diffusion region 32 in FIG. 1 encompassing the memory-cell forming region 25. Thus, the gate oxide film 41 formed on the surface of the guard-ring diffusion region 32 is under the same condition as the high breakdown voltage gate oxide film 41 of the peripheral circuit region 27, whereupon the height of the silicon nitride film 45 serving as the CMP stopper of the guard-ring diffusion region 32 is rendered equal to the height of the silicon nitride film 45 serving as the CMP stopper of the peripheral circuit region 27. Consequently, occurrence of dishing due to the CMP planarization process can be limited.

The guard-ring diffusion region 32 is disposed so as to encompass the memory cell array in order that the potential of the P-well 24 enclosing the memory cell array may be stabilized. Accordingly, since the guard-ring diffusion region is not a pattern added for improvement in the defect of the CMP planarization process, the chip area is not increased.

The foregoing is also applied to the relationship between the high breakdown voltage region and the peripheral low breakdown voltage region in the peripheral circuit region 27. When the low breakdown voltage region is encompassed by the high breakdown voltage region, the oxide film of the high breakdown voltage region is used as the oxide film on the surface of the guard-ring diffusion region, whereupon the same effect as described above is expected. In this case, since the memory cell array is formed in the P-well 24, the guard-ring diffusion region is formed as a diffusion layer filled with P-type impurity.

In the following description, the subsequent process steps will be described with the arrangement preventing dishing as shown in FIG. 12 being employed. In the state as shown in FIG. 12, a high-temperature annealing process is carried out so that each of the oxide films 54 filling the STI's 28 to 30 is released from an inner stress. Subsequently, a wetting process is carried out so that small scratch marks on the surface of the doped oxide film 54, foreign matter adherent during the polishing in the CMP planarization process or the like are removed.

Figure 13:
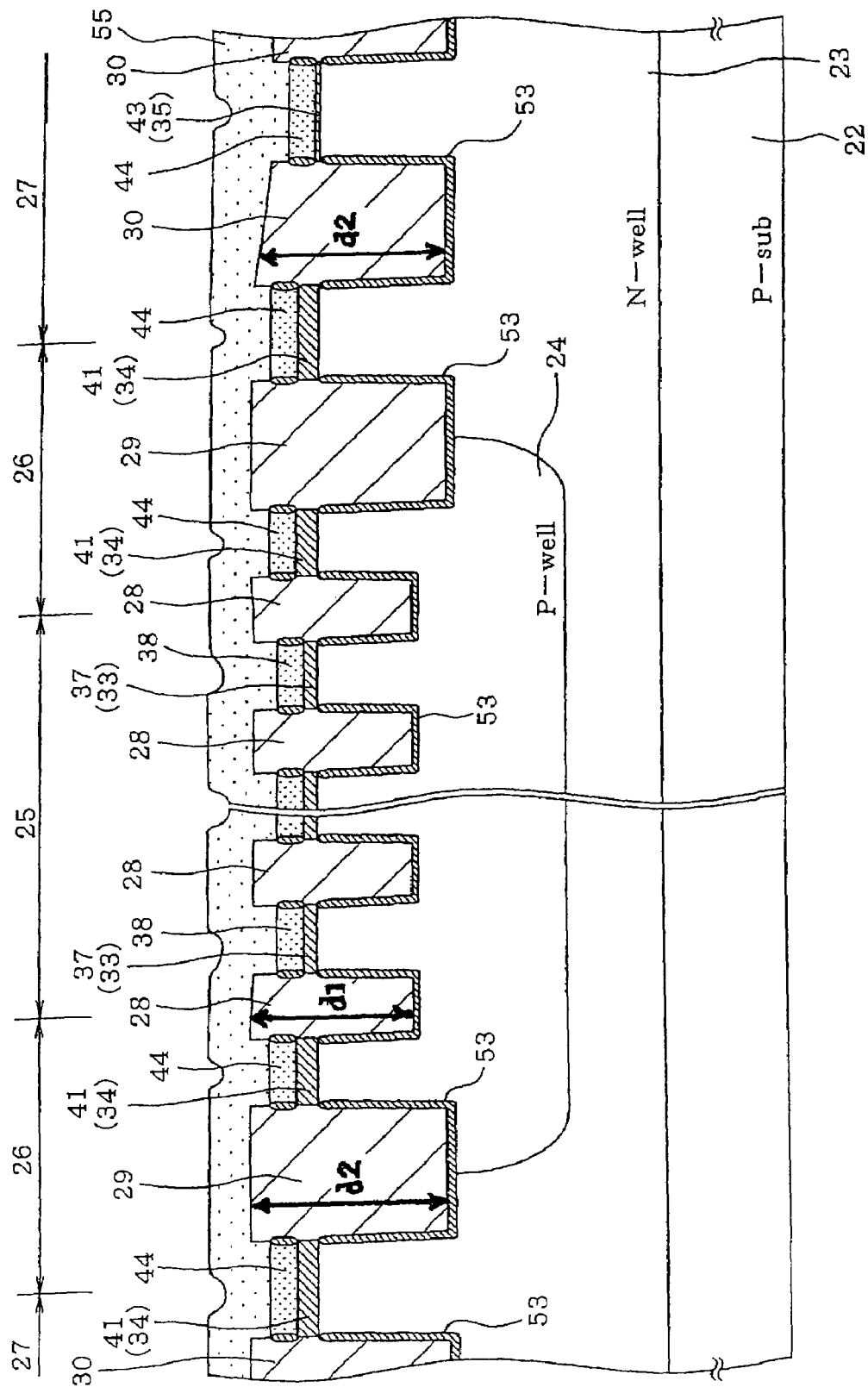
Figure 14:
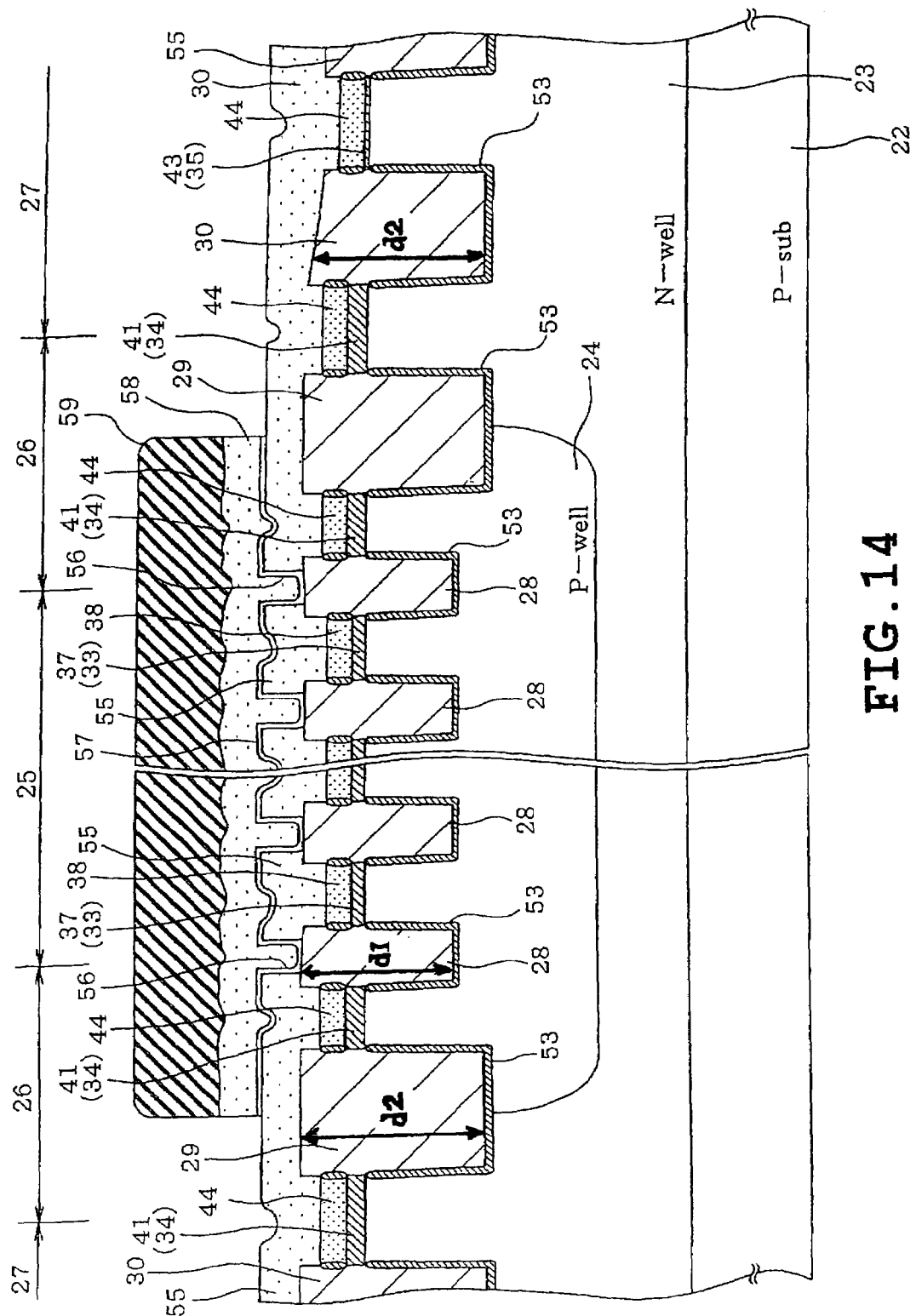

The silicon nitride films 39 and 45 used as the masking material and the stopper material are removed by a wet etching process using hot phosphoric acid. Successively, a polycrystalline silicon film 55 doped with phosphorus is deposited so that an upper part of the floating gate of the memory cell is formed as shown in FIG. 13. Subsequently, cell slits 56 are formed by photolithography so that floating gates of the MOS transistors of the memory cell are formed, as shown in FIG. 14. An oxide-nitride-oxide (ONO) insulation film 57 is formed so as to be interposed between the floating gate and a control gate. Furthermore, a polycrystalline silicon film 58 serving as a control gate is deposited on the insulation film 57 so as to have a predetermined film thickness.

Figure 15:
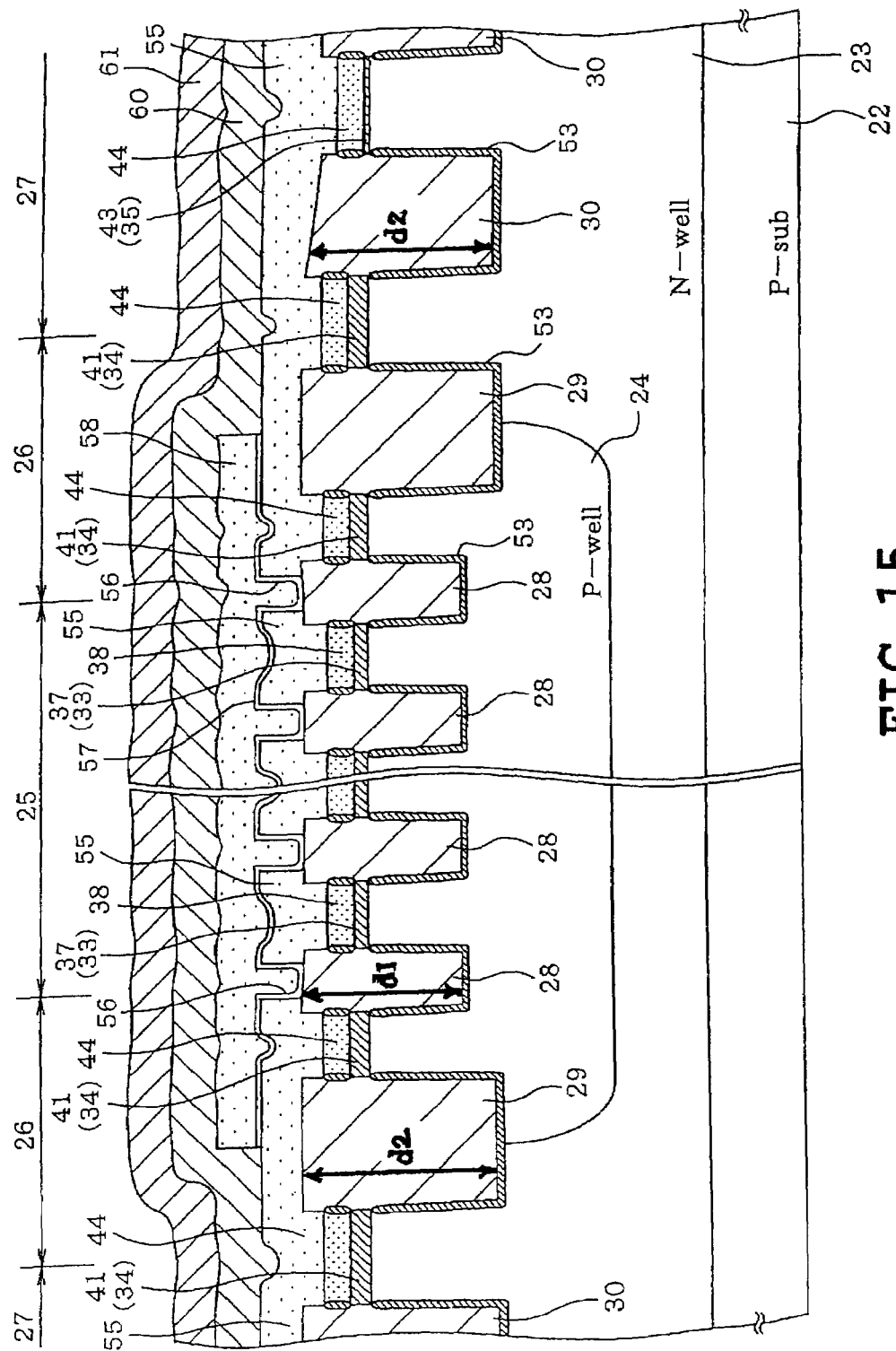

Thereafter, a photolithography process is carried out to pattern a photoresist 59. The polycrystalline silicon film 58 and the ONO insulation film 57 of the peripheral circuit section 27 are removed by the dry etching process as shown in FIG. 14. Subsequently, a tungsten silicide (WSi) film 60 serving as a gate electrode is deposited on the polycrystalline silicon films 55 and 58 and a TEOS film 61 serving as a hard mask used during formation of the gate electrode is in turn deposited on the WSi film 60, as shown in FIG. 15.

Figure 16:
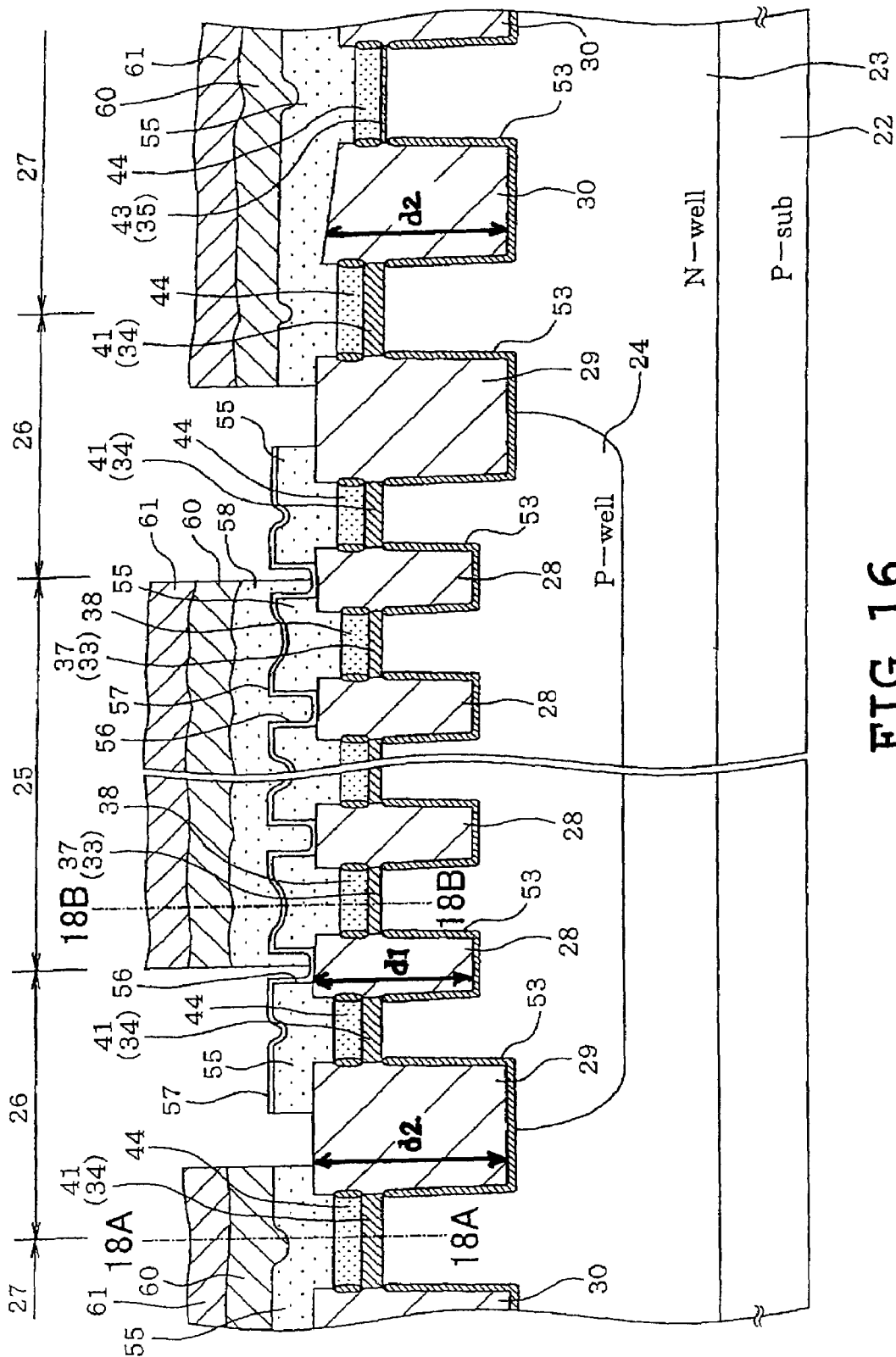

Successively, the photolithography process is carried out to pattern the photoresist in order that the gate electrodes in the memory-cell forming region 25 and the peripheral circuit region 27 may be patterned, as shown in FIG. 16. The films 61, 60, 58 and 57 in the memory-cell forming region 25 are removed by etching and simultaneously, gate electrodes of the transistor in the peripheral circuit region 27 are formed. FIG. 16 is a section taken along a center line (line 16-16 in FIG. 17) of the gate electrode formed through the foregoing steps in the plan view of the semiconductor device 21 shown in FIG. 17. Furthermore, FIG. 17 shows a portion where the ONO insulation film 57 is exposed as a slashed region.

Figure 17:
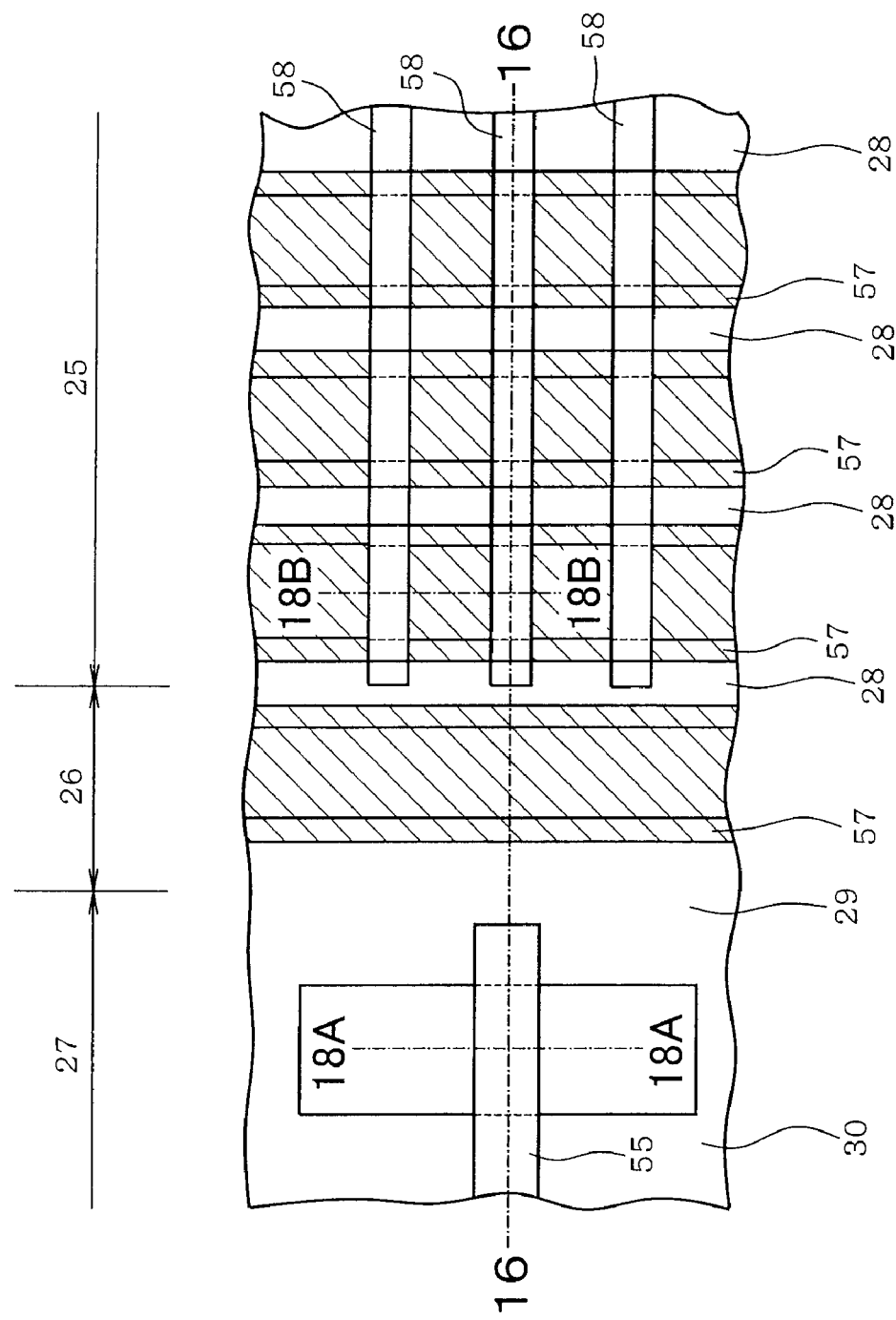
FIG. 17 is a plan view of the semiconductor device, including line 16-16 along which the section of FIG. 16 is taken and lines 18A-18A and 18B-18B along which sections of FIGS. 18A and 18B are taken respectively.
Figure 18A:
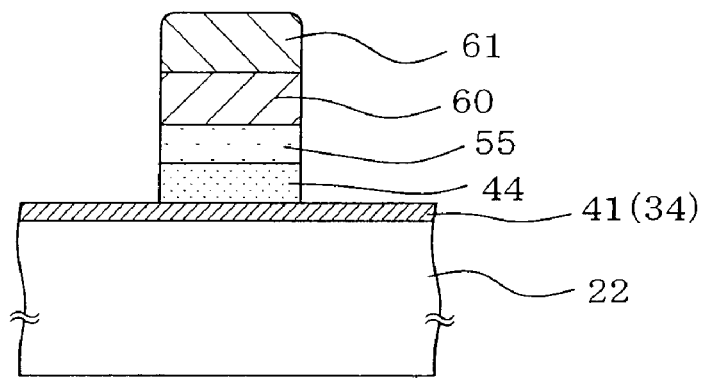
FIGS. 18A and 18B are typical sectional views taken along lines 18A-18A and 18B-18B in FIG. 16 respectively.
Figure 18B:
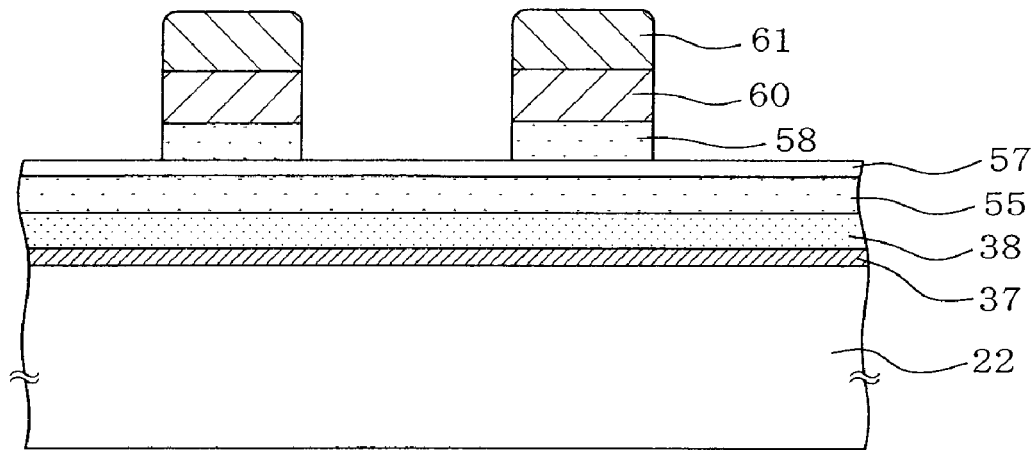

FIGS. 18A and 18B are sectional views taken along lines 18A-18A and 18B-18B in FIGS. 16 and 17 or more specifically, gate electrode portions of the transistors in the peripheral circuit section 27 and the memory-cell forming region 25, respectively. The transistor of the peripheral circuit region 27 is formed with a gate electrode as shown in FIG. 18A, whereas the floating gate portions are connected together before the etching as shown in FIG. 18B.

Figure 20:
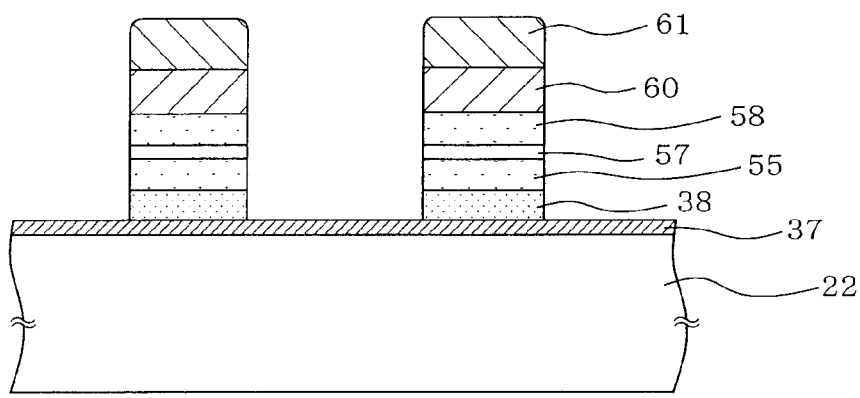
FIG. 20 is a typical sectional view taken along line 20-20 in FIG. 19.

Subsequently, the peripheral circuit region 27 is patterned by the photolithography process so as to be covered by a photoresist 62 and thereafter, the ONO insulation film 57 and polycrystalline silicon films 55 and 38 all of which are to be patterned are removed by the RIE method, as shown in FIGS. 19 and 20. A part of the semiconductor device as shown in FIG. 20 corresponds to the portion as shown in FIG. 18B and is a section taken along line 20-20 in FIG. 19. As a result, the gate electrode of the memory cell is formed into a stacked structure including the polycrystalline silicon layers 38 and 55, ONO insulation film 57, polycrystalline silicon layer 58, WSi film 60 and TEOS film 61 sequentially from the bottom side.

Thereafter, an ion implantation process is carried out so that impurity diffusion regions such as source/drain required for formation of transistor. Further, each gate electrode is formed with side walls and subsequently, an N-type high density impurity diffusion region is formed. In this case, for example, a memory cell in the P-well 23 is filled with a high density impurity and the guard-ring diffusion region 32 is filled with a P-type high density impurity.

Figure 21:
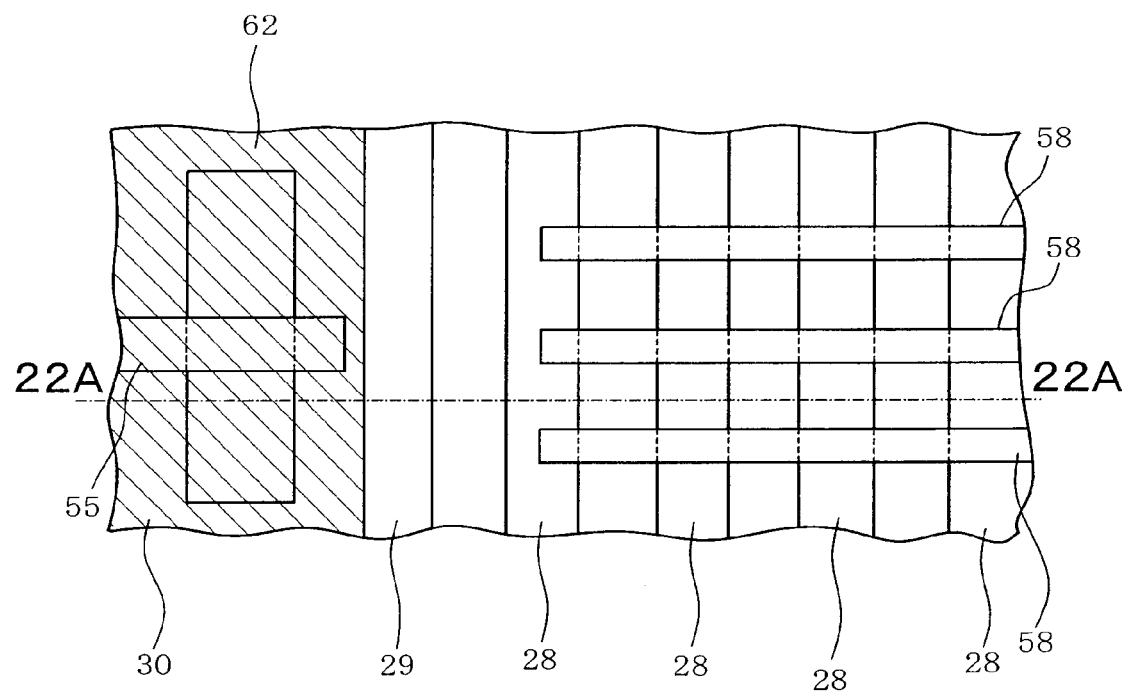
FIG. 21 is a plan view taken along line E-E in FIG. 22.

FIG. 21 shows the state after the stacked structure of the gate electrode has been formed in the state as shown in FIG. 17, or in other words, FIG. 21 is a plan view of the semiconductor device corresponding to the section as shown in FIG. 19. In the following description, the aforementioned impurity diffusion region will be described with reference to FIG. 21 showing the diffusion region portion along a line formed with a gate electrode pattern or FIGS. 22A, 22B and 22C showing the states of the section taken along line 22A-22A in FIG. 21.

Figure 22A:
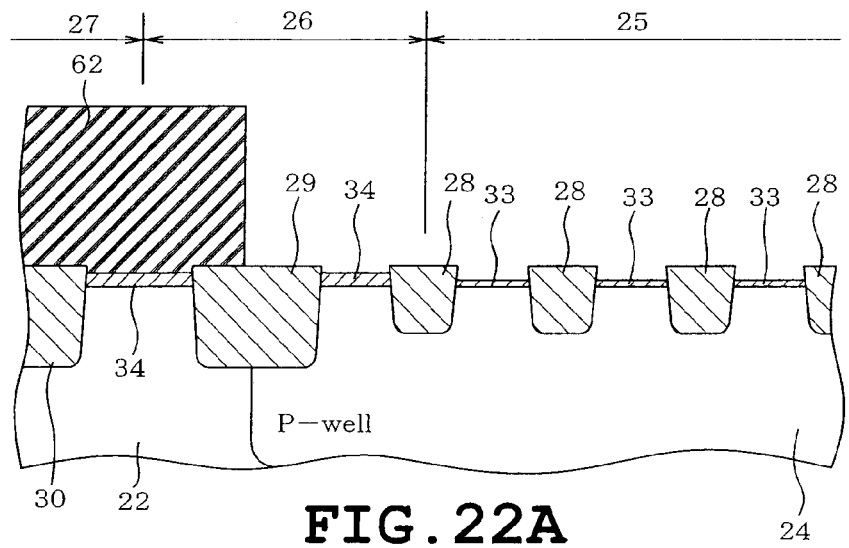
FIG. 22 is a typical sectional view of a part of the semiconductor device in the fabricating step.

FIG. 22A shows a section of the semiconductor device as shown in FIG. 20 and taken along line 22A-22A in FIG. 21. In the memory-cell forming region 25, each element region formed with a first gate oxide film 34 on the surface of the silicon substrate 22 formed with the P-well 22 is separated by the first STI 28. Further, in the boundary region 26 and peripheral circuit region 27, an element region is provided which includes a gate oxide film 34 formed on the surface of the silicon substrate 22. The element region is isolated by the second and third STI's 29 and 30. Still further, in this state, a photoresist 62 is patterned so as to cover the upper portion of the peripheral circuit region 27.

Figure 22B:
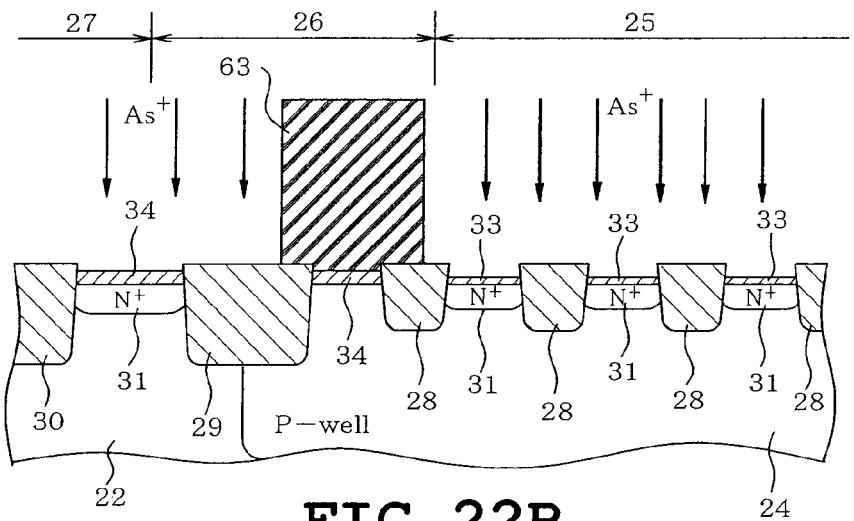
Figure 22C:
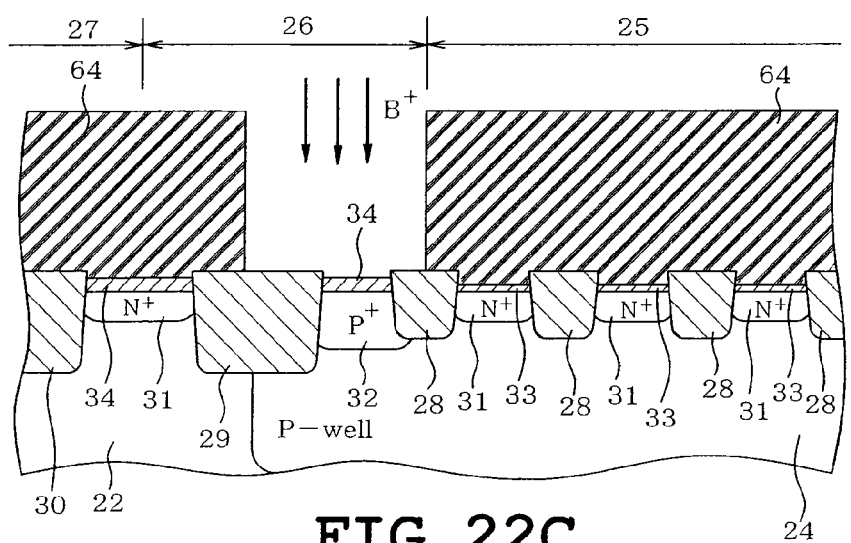

FIG. 22B shows a pattern of an ion implantation process in the case where the semiconductor device is doped with an n-type impurity. The photoresist 62 is removed from the silicon substrate 22 and successively, a photoresist 63 is patterned so as to cover the boundary region 26 and a part of the peripheral circuit region 27 required to be covered (not shown). In this state, arsenic (As) serving as an n-type impurity is implanted by the ion implantation process so that a high-density n-type impurity diffusion region 31 is formed in the corresponding parts of the memory-cell forming region 25 and peripheral circuit region 27.

Successively, the photoresist 63 is removed and thereafter, a photoresist 64 is patterned so as to cover upper surfaces except for that of the boundary region 26. The boundary region 26 of the silicon substrate 22 is doped with boron (B) serving as a p-type impurity so that a p-type guard-ring diffusion region 32 is formed. Thereafter, the photoresist 64 is removed and successively, the process of fabricating the wafer of non-volatile memory is completed through other forming steps including a usual contact step, wiring layer forming step, passivation film forming step and the like although none of these steps are shown. In this case, heat treatment is applied so that diffusion reaches respective predetermined depths with respect to the diffusion regions 31 and 32 and other diffusion regions (not shown).

When the foregoing arrangement and fabrication steps are employed, first, second and third STI's 28, 29 and 30 can be formed in the process of forming the trenches 49 to 51 having different depths. Further, the gate electrodes can be formed by the self-alignment process simultaneously. The second STI 29 having the second depth is formed so as to be located deep right near the guard-ring diffusion region 32, and the p-n junction of the p-well 24 terminates at the bottom. Consequently, space saving can be achieved while a predetermined breakdown voltage is ensured.

Further, since the inner and outer peripheral gate insulating films of the guard-ring diffusion region 32 have the same film thickness, steps at both sides of the deeper second STI 29 can be dissolved. This can prevent occurrence of defects such as dishing due to the difference in the heights of the stoppers during CMP process, whereupon a high quality of planarization can be realized.

Still further, even when high and low breakdown voltage transistors have different film thicknesses of gate insulating films in the peripheral circuit region 27, a low breakdown voltage element forming region of the thinner gate oxide film 35 is encompassed by the high breakdown voltage element forming region. Consequently, a high quality of planarization which can provide desirable planarity can be realized in the CMP process.

The foregoing embodiment may be modified or expanded as follows. The invention may be applied to a process not employing the CMP process.

The gate insulating films 34 on the surface of the silicon substrate 22 in the boundary region 26 are set to have the same film thickness in the foregoing embodiment. However, the gate insulating films may or may not be set so as to have the same film thickness.

The trench isolating region may be formed so as to have three or more different depths, instead.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:
    forming a first well of a second conduction type and a second well of a first conduction type on a semiconductor substrate of the first conduction type;
    forming a gate oxide corresponding to each element on a surface of the semiconductor substrate;
    forming trenches by etching at forming locations of first and second trench isolating regions respectively at a first depth larger than a depth of a diffusion layer formed in a memory-cell forming region within the second well and smaller than a depth of a diffusion layer of a transistor of a peripheral circuit region;
    executing additional etching at a forming location of the second trench isolating region so that a second depth larger than the first depth is obtained; and
    doping the trenches at the forming locations of the first and second trench isolating regions respectively, with a doping agent, thereby executing a planarization process.

2. The method according to claim 1, wherein the gate dielectric film forming step includes a step of forming a gate dielectric film having a first film thickness corresponding to a transistor of the memory-cell forming region and a step of forming a gate dielectric film having a second film thickness corresponding to a transistor of the peripheral circuit region.

3. The method according to claim 1, wherein in the gate dielectric film forming step, the gate dielectric film having the second film thickness is formed on a surface of a guard-ring diffusion region formed around the memory-cell forming region within the second well.

4. The method according to claim 2, wherein in the gate dielectric film forming step, the gate dielectric film having the second film thickness is formed on a surface of a guard-ring diffusion region formed around the memory-cell forming region within the second well.

\* \* \* \* \*